(12) United States Patent
Yim et al.

(10) Patent No.: US 9,653,400 B2
(45) Date of Patent: May 16, 2017

(54) SEMICONDUCTOR DEVICE AND METHOD OF MANUFACTURING THE SAME

(71) Applicant: Samsung Electronics Co., Ltd., Suwon-si, Gyeonggi-do (KR)

(72) Inventors: Tae-Jin Yim, Yongin-si (KR); Woo-Kyung You, Incheon (KR); Jong-Min Baek, Seoul (KR); Sang-Hoon Ahn, Goyang-si (KR); Thomas Oszinda, Hwaseong-si (KR); Kee-Young Jun, Seongnam-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 14/984,085

(22) Filed: Dec. 30, 2015

(65) Prior Publication Data
US 2016/0211211 A1 Jul. 21, 2016

(30) Foreign Application Priority Data
Jan. 19, 2015 (KR) ........................ 10-2015-0008714

(51) Int. Cl.
| | |
|---|---|
| H01L 23/48 | (2006.01) |
| H01L 23/52 | (2006.01) |
| H01L 29/40 | (2006.01) |
| H01L 23/532 | (2006.01) |
| H01L 21/768 | (2006.01) |
| H01L 23/522 | (2006.01) |

(52) U.S. Cl.
CPC .... *H01L 23/53295* (2013.01); *H01L 21/7682* (2013.01); *H01L 21/76814* (2013.01); *H01L 21/76826* (2013.01); *H01L 21/76831* (2013.01); *H01L 23/5222* (2013.01); *H01L 21/76834* (2013.01); *H01L 21/76849* (2013.01); *H01L 23/5226* (2013.01); *H01L 23/53223* (2013.01); *H01L 23/53238* (2013.01); *H01L 23/53266* (2013.01); *H01L 2924/0002* (2013.01)

(58) Field of Classification Search
CPC ............ H01L 21/7682; H01L 23/5329; H01L 21/02203
USPC ................................. 257/750, 758
See application file for complete search history.

(56) References Cited

U.S. PATENT DOCUMENTS

| | | | |
|---|---|---|---|
| 6,399,476 B2 | 6/2002 | Kim et al. | |
| 6,803,326 B2* | 10/2004 | Ahn ................. | H01L 21/02126 257/E21.273 |
| 7,098,149 B2 | 8/2006 | Lukas et al. | |
| 7,473,632 B2 | 1/2009 | Ueda | |
| 7,501,347 B2 | 3/2009 | Noguchi et al. | |
| 7,910,936 B2 | 3/2011 | Ajmera et al. | |

(Continued)

*Primary Examiner* — S. V. Clark
(74) *Attorney, Agent, or Firm* — Harness, Dickey & Pierce, P.L.C.

(57) ABSTRACT

A semiconductor device is provided. The semiconductor device includes a first porous interlayer insulating film having a low dielectric constant and including a first region and a second region, a second interlayer insulating film formed on the first interlayer insulating film in the first region, a plurality of first conductive patterns formed in the second interlayer insulating film such that the plurality of first conductive patterns are spaced apart from each other, at least one second conductive pattern formed in the first interlayer insulating film in the second region and air gaps disposed at lateral sides of the plurality of first conductive patterns.

20 Claims, 32 Drawing Sheets

(56) References Cited

U.S. PATENT DOCUMENTS

| | | |
|---|---|---|
| 8,445,075 B2 | 5/2013 | Xu et al. |
| 8,481,422 B2 | 7/2013 | Chan et al. |
| 8,492,170 B2 | 7/2013 | Xie et al. |
| 2004/0214427 A1* | 10/2004 | Kloster ............... H01L 21/3105 438/637 |
| 2007/0111535 A1 | 5/2007 | Yu et al. |
| 2008/0311728 A1 | 12/2008 | Asako et al. |
| 2009/0321945 A1 | 12/2009 | Besling |
| 2014/0287586 A1* | 9/2014 | Matsui ................. B24B 37/042 438/692 |

* cited by examiner

SEMICONDUCTOR DEVICE AND METHOD OF MANUFACTURING THE SAME

This application claims priority from Korean Patent Application No. 10-2015-0008714 filed on Jan. 19, 2015 in the Korean Intellectual Property Office, the disclosure of which is incorporated herein by reference in its entirety.

BACKGROUND

1. Field

Example embodiments of the inventive concepts relate to a semiconductor device and a method of manufacturing the same.

2. Description of the Related Art

In a back end of line (BEOL) process of a semiconductor device, one of the important issues is to pattern a plurality of wirings and eliminate the interference phenomenon between these wirings.

However, recently, with the rapid decrease in the scale of a semiconductor device and the decrease in the interval between wirings, methods for reducing the insulation and capacitance between wirings have been widely developed.

For this purpose, a method of reducing the capacitance using a low-dielectric-constant film has been used, and thus problems with modulus, that is, durability of the low-dielectric-constant film have been issued.

Therefore, it has been required to develop a method for solving the problems with both dielectric constant and durability.

SUMMARY

Example embodiments of the inventive concepts provide a semiconductor device which can reduce the dielectric constant of an insulating film between wirings and can increase the durability thereof.

According to an example embodiment of the inventive concepts, a semiconductor device includes a first porous interlayer insulating film having a low dielectric constant and including a first region and a second region, a second interlayer insulating film formed on the first interlayer insulating film in the first region, a plurality of first conductive patterns formed in the second interlayer insulating film such that they are spaced apart from each other, at least one second conductive pattern formed in the first interlayer insulating film in the second region and air gaps disposed at lateral sides of the plurality of first conductive patterns.

In some example embodiments, upper surfaces of the first conductive patterns are flush with an upper surface of the second conductive pattern.

In some example embodiments, the semiconductor device may further comprise a first trench formed in the first interlayer insulating film and filled with the second conductive pattern and a sealing film formed on the inner wall of the first trench to seal the inner wall surface of the first interlayer insulating film.

In some example embodiments, the semiconductor device may further comprise a barrier metal film between the sealing film and the second conductive pattern.

In some example embodiments, a height of an upper surface of the first interlayer insulating film in the first region is lower than a height of an upper surface of the first interlayer insulating film in the second region.

In some example embodiments, each of the first and/or second conductive patterns includes a via penetrating the first interlayer insulating film.

In some example embodiments, the semiconductor device may further comprise a capping film formed on the upper surface of each of the first and second conductive patterns to cover each of the first and second conductive patterns.

In some example embodiments, the capping film contains Co and/or AlN.

In some example embodiments, each of the first and second conductive patterns contains Cu, W, Co, and/or Al.

In some example embodiments, the air gaps are formed only between the plurality of first conductive patterns.

In some example embodiments, the second conductive pattern comprises at least two conductive patterns. An interval between the at least two second conductive patterns is equal to or greater than an interval between the first conductive patterns.

According to another example embodiment of the inventive concepts, a semiconductor device includes a first structure including a first region and a second region and a second structure including a third region and a fourth region and disposed on the first structure, wherein the first structure includes a first interlayer insulating film containing a first porous ultra-low-dielectric constant material, a second interlayer insulating film formed on the first interlayer insulating film in the first region, a plurality of first conductive patterns formed in the second interlayer insulating film such that the plurality of first conductive patterns are spaced apart from each other, at least one second conductive pattern formed in the first interlayer insulating film in the second region and first air gaps disposed at lateral sides of the plurality of first conductive patterns, and wherein the second structure includes a third interlayer insulating film containing a second porous ultra-low-dielectric constant material, a fourth interlayer insulating film formed on the third interlayer insulating film in the third region, a plurality of third conductive patterns formed in the fourth interlayer insulating film such that the plurality of third conductive patterns are spaced apart from each other, at least one fourth conductive pattern formed in the third interlayer insulating film in the fourth region and second air gaps disposed at lateral sides of the plurality of third conductive patterns.

In some example embodiments, the dielectric constant of the first interlayer insulating film is different from the dielectric constant of the third interlayer insulating film.

In some example embodiments, the dielectric constant of the first interlayer insulating film is higher than the dielectric constant of the third interlayer insulating film.

In some example embodiments, the porosity of the first porous ultra-low-dielectric constant material is different from the porosity of the second porous ultra-low-dielectric constant material.

In some example embodiments, the semiconductor device may further comprise a first trench formed in the first interlayer insulating film and filled with the second conductive pattern, a second trench formed in the third interlayer insulating film and filled with the fourth conductive pattern and a sealing film conformally formed on the inner wall of the first trench and/or the second trench to seal the inner wall surface of the first interlayer insulating film and/or the third interlayer insulating film.

According to still another example embodiment of the inventive concepts, a semiconductor device, includes a first porous interlayer insulating film containing a porous ultra-low-dielectric constant material, a plurality of conductive patterns formed on the first interlayer insulating film such that the plurality of conductive patterns are spaced apart from each other, air gaps formed at lateral sides of the plurality of conductive patterns and a second interlayer insulating film formed on the plurality of conductive patterns, the air gaps, and the first interlayer insulating film.

In some example embodiments, some of the plurality of conductive patterns include a via pattern penetrating the first interlayer insulating film.

In some example embodiments, the porosity of the porous ultra-low-dielectric constant material is 0% to 80%.

In some example embodiments, the semiconductor device may further comprise a coating film formed between the first interlayer insulating film and the air gaps.

BRIEF DESCRIPTION OF THE DRAWINGS

The above and other aspects and features of the inventive concepts will become more apparent by describing in detail example embodiments thereof with reference to the attached drawings, in which.

DETAILED DESCRIPTION

Figure 1:
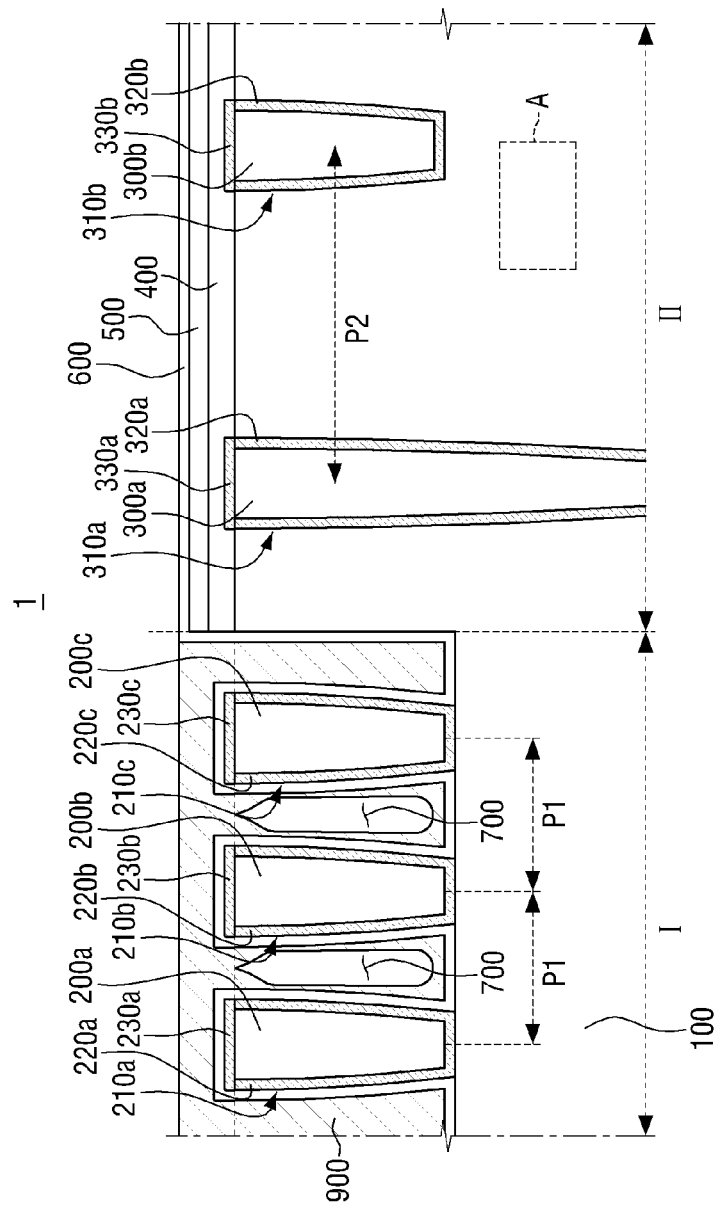
FIG. 1 is a cross-sectional view for explaining a semiconductor device according to an example embodiment of the inventive concepts.

The inventive concepts will now be described more fully hereinafter with reference to the accompanying drawings, in which example embodiments of the inventive concepts are shown. These example embodiments may, however, be embodied in different forms and should not be construed as limited to the example embodiments set forth herein. Rather, these example embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concepts.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or example terms provided herein is intended merely to better illuminate the invention and is not a limitation on the scope of the invention unless otherwise specified. Further, unless defined otherwise, all terms defined in generally used dictionaries may not be overly interpreted.

Hereinafter, a semiconductor device 1 according to an example embodiment of the inventive concepts will be described with reference to FIGS. 1 and 2.

Figure 2:
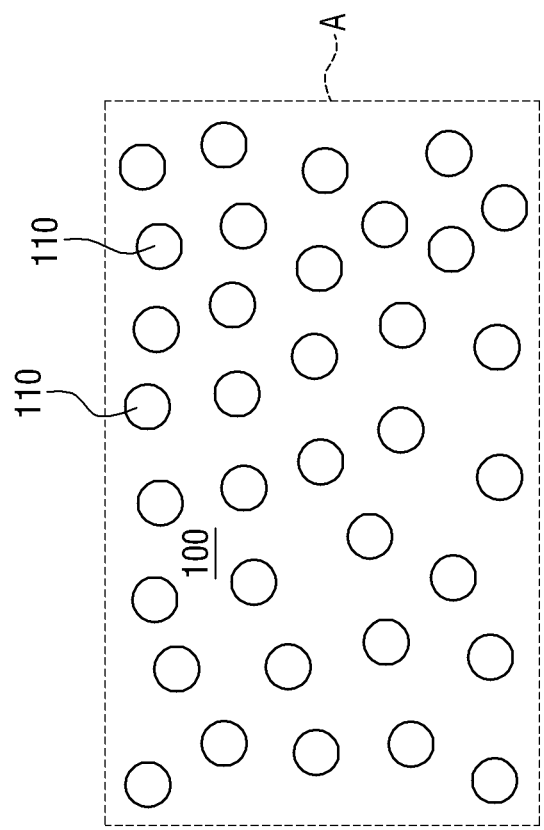
FIG. 2 is an enlarged sectional view of A for explaining a first interlayer insulating film of FIG. 1.

FIG. 1 is a cross-sectional view for explaining the semiconductor device 1 according to an example embodiment of the inventive concepts and FIG. 2 is an enlarged sectional view of A for explaining a first interlayer insulating film of FIG. 1.

Referring to FIG. 1, the semiconductor device 1 according to an example embodiment of the inventive concepts includes a first interlayer insulating film 100, first trenches 210*a*, 210*b* and 210*c*, second trenches 310*a* and 310*b*, first metals 200*a*, 200*b* and 200*c*, second metals 300*a* and 300*b*, first barrier metals 220*a*, 220*b* and 220*c*, second barrier metals 320*a* and 320*b*, first capping films 230*a*, 230*b* and 230*c*, second capping films 330*a* and 330*b*, a second interlayer insulating film 900, a first intermediate film 400, a first mask film 500, a first coating film 600, and a first air gap 700.

The first interlayer insulating film 100 can cover other semiconductor devices disposed thereunder. For example, the first interlayer insulating film 100 can be formed in order to form a wiring structure on a semiconductor device such as a transistor or on another wiring structure.

The first interlayer insulating film 100 may include a silicon oxide film. The first interlayer insulating film 100 may be a film made of Si—OCH, which is not limited thereto. The first interlayer insulating film 100 may be a porous silicon oxide film. For example, the first interlayer insulating film 100 may be a porous film made of p-Si—OCH (porous-Si—OCH).

The first interlayer insulating film 100 may be an ultra-low dielectric constant film having a very low dielectric constant (ultra low-k, ULK). The dielectric constant k of the first interlayer insulating film 100 may be 3.00 or less. In some example embodiments, the dielectric constant k of the first interlayer insulating film 100 may be 2.55, which is not limited thereto. The first interlayer insulating film 100 may be an insulating film having a low dielectric constant because it has a plurality of pores therein.

Referring to FIG. 2, the first interlayer insulating film 100 may have pores 110 formed therein. These pores 110 serve to lower the total dielectric constant of the first interlayer insulating film 100. These pores 110 can retain air having a low k value therein. As the ratio of area of the pores 110 to area of first interlayer insulating film 100 (i.e., porosity) increases, the dielectric constant of the first interlayer insulating film 100 may be lowered.

The porosity of the first interlayer insulating film 100 may be 0% to 80%, which is not limited thereto. As the porosity of the first interlayer insulating film 100 increases, the dielectric constant thereof may be lowered, whereas the durability thereof may be deteriorated. Therefore, the first interlayer insulating film 100 may be damaged during an etching process for forming a wiring. Accordingly, a process of reducing or preventing the damage of the first interlayer insulating film 100 may be required.

For example, the first interlayer insulating film 100 may be subjected to a pore-stuffing process. The pore-stuffing process is a process of reducing or preventing the damage of the first interlayer insulating film 100 occurring during an etching process by filling the pores 110 of the first interlayer insulating film 100 with a stuffing material before the etching process. This pore-stuffing process will be described later.

Referring again to FIG. 1, the first interlayer insulating film 100 may include a first region (I) and a second region (II). The height of upper surface of the first interlayer insulating film 100 in the first region (I) may be different from the height of upper surface of the first interlayer insulating film 100 in the second region (II). Specifically, the height of upper surface of the first interlayer insulating film 100 in the first region (I) may be lower than the height of upper surface of the first interlayer insulating film 100 in the second region (II). For example, the first interlayer insulating film 100 may include the selectively etched first region (I) and the non-etched or relatively less etched second region (II).

The second interlayer insulating film 900 may be formed on the first interlayer insulating film 100. The second interlayer insulating film 900 may be formed on the first region (I) of the first interlayer insulating film 100. For example, if the first interlayer insulating film 100 is selectively etched, the second interlayer insulating film 900 may be formed on the etched portion of the first interlayer insulating film 100. Therefore, the upper surface of the second interlayer insulating film 900 may be substantially coplanar with the upper surface of the first interlayer insulating film 100 in the second region (II).

The second interlayer insulating film 900 may include silicon oxide, silicon nitride, silicon oxynitride, or a combination thereof. Furthermore, the second interlayer insulating film 900 may include the same material as the first interlayer insulating film 100, which is not limited thereto.

The first trenches 210a, 210b and 210c may be formed in the second interlayer insulating film 900. The first trenches 210a, 210b and 210c may be formed to be spaced apart from each other at first intervals P1. The first trenches 210a, 210b and 210c may be provided therein with first metals 200a, 200b and 200c, respectively. Specifically, the first trenches 210a, 210b and 210c may be provided therein with conformal first barrier metals 220a, 220b and 220c and first metals 200a, 200b and 200c, respectively. The first barrier metals 220a, 220b and 220c may be conformally formed along the inner walls of the first trenches 210a, 210b and 210c, respectively, and the first metals 200a, 200b and 200c can completely fill the first trenches 210a, 210b and 210c, respectively.

Each of the first trenches 210a, 210b and 210c may have a vertical shape, but, as shown in FIG. 1, may have a shape in which the width of the lower portion thereof is narrower than that of the upper portion thereof, which is not limited thereto. The bottom of each of the first trenches 210a, 210b and 210c may be the first interlayer insulating film 100, which is not limited thereto. The first trenches 210a, 210b and 210c may also be formed to penetrate the first interlayer insulating film 100. If the bottom of each of the first trenches 210a, 210b and 210c is the first interlayer insulating film 100, the first trenches 210a, 210b and 210c form a linear wiring structure. If the first trenches 210a, 210b and 210c penetrate the first interlayer insulating film 100, the first trenches 210a, 210b and 210c form a via structure in which different wirings are vertically connected to each other. In other words, the first trenches 210a, 210b and 210c may be formed into a wiring structure or a via structure. A plurality of first trenches 210a, 210b and 210c may be formed. Therefore, some of the first trenches 210a, 210b and 210c may be formed into a wiring structure, and others thereof may be formed into a via structure.

The second trenches 310a and 310b may be formed in the first interlayer insulating film 100. The second trenches 310a and 310b may be formed in the second region (II) of the first interlayer insulating film 100. The second trenches 310a and 310b may be formed to be spaced apart from each other at a second interval P2. The second interval P2 may be equal to or greater than the first interval P1. The second trenches 310a and 310b may be provided therein with second metals 300a and 300b, respectively. Specifically, the second trenches 310a and 310b may be provided therein with conformal second barrier metals 320a and 320b and second metals 300a and 300b, respectively. The second barrier metals 320a and 320b may be conformally formed along the inner walls of the second trenches 310a and 310b, respectively, and the second metals 300a and 300b can completely fill the second trenches 310a and 310b, respectively.

Each of the second trenches 310a and 310b may have a vertical shape, but, as shown in FIG. 1, may have a shape in which the width of the lower portion thereof is narrower than that of the upper portion thereof, which is not limited thereto. The bottom of each of the second trenches 310a and 310b may be located in the first interlayer insulating film 100, which is not limited thereto. The second trenches 310a and 310b may also be formed to penetrate the first interlayer insulating film 100. If the bottom of each of the second trenches 310a and 310b is located in the first interlayer insulating film 100, the second trenches 310a and 310b form a linear wiring structure. If the second trenches 310a and 310b penetrate the first interlayer insulating film 100, the second trenches 310a and 310b form a via structure in which different wirings are vertically connected to each other. In other words, the second trenches 310a and 310b may be formed into a wiring structure or a via structure. A plurality of second trenches 310a and 310b may be formed. Therefore, some of the second trenches 310a and 310b may be formed into a wiring structure, and others thereof may be formed into a via structure.

The first barrier metals 220a, 220b and 220c may be formed in the first trenches 210a, 210b and 210c, respectively. The first barrier metals 220a, 220b and 220c may be conformally formed on the inner walls of the first trenches 210a, 210b and 210c, respectively. Specifically, the first barrier metals 220a, 220b and 220c may be conformally formed on the side walls and bottom surfaces of the first trenches 210a, 210b and 210c, respectively. Each of the first barrier metals 220a, 220b and 220c may be formed between each of the first metals 200a, 200b and 200c and the first and second interlayer insulating films 100 and 900.

The second barrier metals 320a and 320b may be formed in the second trenches 310a and 310b, respectively. The second barrier metals 320a and 320b may be conformally formed on the inner walls of the second trenches 310a and 310b, respectively. Specifically, the second barrier metals 320a and 320b may be conformally formed on the side walls and bottom surfaces of the second trenches 310a and 310b, respectively. Each of the second barrier metals 320a and 320b may be formed between each of the second metals 300a and 300b and the first interlayer insulating film 100.

The first metals 200a, 200b and 200c can fill the first trenches 210a, 210b and 210c, respectively. The first metals 200a, 200b and 200c may be formed on the first barrier metals 220a, 220b and 220c formed on the inner walls of the first trenches 210a, 210b and 210c, respectively. The first metals 200a, 200b and 200c can completely fill the first trenches 210a, 210b and 210c, respectively. Each of the first metals 200a, 200b and 200c may include a metal constituting a wiring or via. Specifically, each of the first metals 200a, 200b and 200c may include Cu, W, Co, and/or Al, which is not limited thereto.

The second metals 300a and 300b can fill the second trenches 310a and 310b, respectively. The second metals 300a and 300b may be formed on the second barrier metals 320a and 320b formed on the inner walls of the second trenches 310a and 310b, respectively. The second metals 300a and 300b can completely fill the second trenches 310a and 310b, respectively. Each of second metals 300a and 300b may include a metal constituting a wiring or via. Specifically, each of the second metals 300a and 300b may include Cu, W, Co, and/or Al, which is not limited thereto. The second metals 300a and 300b and the first metals 200a, 200b and 200c may be simultaneously formed. Furthermore, the upper surface of each of the first metals 200a, 200b and 200c may be substantially coplanar with the upper surface of each of the second metals 300a and 300b.

The first capping films 230a, 230b and 230c can cap the first trenches 210a, 210b and 210c, respectively. The first capping films 230a, 230b and 230c may be formed on the first metals 200a, 200b and 200c in the first trenches 210a, 210b and 210c, respectively. Each of the first capping films 230a, 230b and 230c may include a conductor. For example, each of the first capping films 230a, 230b and 230c may include Co and/or AlN, which is not limited thereto. The first capping films 230a, 230b and 230c are formed in the first trenches 210a, 210b and 210c, respectively, and are not formed in a region in which the first trenches 210a, 210b and 210c are not formed. In other words, a plurality of the first capping films 230a, 230b and 230c may also be formed corresponding to a plurality of the first trenches 210a, 210b and 210c.

The first capping films 230a, 230b and 230c may be formed by chemical vapor deposition (CVD) or electroless deposition (ELD), which is not limited thereto. The method of forming the first capping films 230a, 230b and 230c is not particularly limited as long as the first metals 200a, 200b and 200c can be capped by the first capping films 230a, 230b and 230c.

The second capping films 330a and 330b can cap the second trenches 310a and 310b, respectively. The second capping films 330a and 330b may be formed on the second metals 300a and 300b in the second trenches 310a and 310b, respectively. Each of the second capping films 330a and 330b may include a conductor. For example, each of the second capping films 330a and 330b may contain Co and/or AlN, which is not limited thereto. The second capping films 330a and 330b are formed in the second trenches 310a and 310b, respectively, but, are not formed in a region besides the second trenches 310a and 310b. In other words, a plurality of the second capping films 330a and 330b may also be formed corresponding to a plurality of the second trenches 310a and 310b.

The second capping films 330a and 330b may be formed by chemical vapor deposition (CVD) or electroless deposition (ELD), which is not limited thereto. The method of forming the second capping films 330a and 330b is not particularly limited as long as the second metals 300a and 300b can be capped by the second capping films 330a and 330b.

A plurality of the first metals 200a, 200b and 200c may be formed. The intervals between the plurality of the first metals 200a, 200b and 200c may be first intervals P1. The first intervals P1 may be equal to each other, but are not limited thereto. A plurality of the second metals 300a and 300b may be formed. The interval between the plurality of the second metals 300a and 300b may be a second interval P2. The second interval P2 may be equal to or greater than the first interval P1. For example, the first interval P1 between metal patterns in the first region (I) may be equal to or smaller than the second interval P2 between metal patterns in the second region (II). In other words, since the first region (I), in which the interval between metal patterns is small and the density of metal patterns is high, requires a lower dielectric constant, first air gaps 700 may be formed by etching the first interlayer insulating film 100. In contrast, since the second region (II), in which the interval between metal patterns is great and the density of metal patterns is low, does not require a relatively low dielectric constant compared to the first region (I), an ultra-low-dielectric-constant film can be used as the first interlayer insulating film 100 without the first air gaps 700.

The first intermediate film 400 may be formed in the second region (II). The first intermediate film 400 may be formed on the second capping films 330a and 330b and the first interlayer insulating film 100 in the second region (II). The first intermediate film 400 may be formed relatively thinly compared to the first interlayer insulating film 100. The first intermediate film 400 may be made of silicon nitride, for example, SiCN, which is not limited thereto. For example, the first intermediate film 400 may also be made of SiOC.

The first mask film 500 may be formed in the second region (II). The first mask film 500 may be formed on the first intermediate film 400 in the second region (II). The first mask film 500 may be formed relatively thinly compared to the first interlayer insulating film 100. The etch rate of the first mask film 500 may be less than that of the first interlayer insulating film 100. The first mask film 500 may be made of silicon nitride, for example, SiON, which is not limited thereto. The first mask film 500 may serve to allow the second region (II) not to be etched while the first region (I) is etched.

The first coating film 600 may be formed in both the first region (I) and the second region (II). In the first region (I), the first coating film 600 may be formed on the first interlayer insulating film 100, the first barrier metals 220a, 220b and 220c, and the first capping films 230a, 230b and 230c. The first coating film 600 may be formed beneath the second interlayer insulating film 900 and the first air gaps 700.

Specifically, in the first region (I), the first coating film 600 may be formed on the upper surface of the first interlayer insulating film 100, which is not overlapped with the first metals 200a, 200b and 200c and the first barrier metals 220a, 220b and 220c. Moreover, the first coating film 600 may be formed along the outer walls of the first barrier metals 220a, 220b and 220c. Since the upper surfaces of the first metals 200a, 200b and 200c are respectively capped by the first capping films 230a, 230b and 230c, the first coating film 600 may be formed along the upper surfaces of the first capping films 230a, 230b and 230c. That is, the first coating film 600 may be conformally formed along the surfaces of the first interlayer insulating film 100, the first barrier metals 220a, 220b and 220c, and first capping films 230a, 230b and 230c.

In the second region (II), the first coating film 600 may be formed on the upper surface of the first mask film 500. The first coating film 600 may be formed on the recessed lateral side of the first interlayer insulating film 100, by which the first interlayer insulating film 100 is divided into the first region (I) and the second region (II), as well as on the upper surface of the first mask film 500. That is, the first intermediate film 400, the first mask film 500, and the first interlayer insulating film 100 may have a coplanar etched surface, and the first coating film 600 may be formed along the etched surface. In other words, the first coating film 600 may be formed in the shape entirely extending in the first region (I) and the second region (II).

The first air gaps 700 may be formed at the lateral sides of the first metals 200a, 200b and 200c. The first air gap 700 may be formed at the lateral side of each of a plurality of the first metals 200a, 200b and 200c. The first air gaps 700 may be formed between the plurality of the first metals 200a, 200b and 200c, but are not limited thereto. The first air gaps 700 may be filled with air. Since air is a material having a very low dielectric constant k, when the first air gaps 700 are formed in the second interlayer insulating film 900, the parasitic capacitance of the second interlayer insulating film 900 is reduced. Therefore, the reliability of the semiconductor device 1 can be improved.

The first air gaps 700 may be formed by the deposition of the second interlayer insulating film 900 having poor step coverage. Thus, the first air gaps 700 may be formed between the first metals 200a, 200b and 200c adjacent to each other at first intervals P1. However, the first air gap 700 may not be formed when other adjacent metal pattern does not exist even at the lateral sides of the first metals 200a, 200b and 200c. The first air gaps 700 may not be formed at the right side of the first metal 200c located at the right in FIG. 1 and the left side of the first metal 200a located at the left in FIG. 1 because other adjacent metal pattern does not exist here. However, the present disclosure is not limited thereto. Although the first air gap 700 is not shown at the right side of the first metal 200c located at the right in FIG. 1, the first air gap 700 may be formed here because the etched lateral side of the first interlayer insulating film 100 is adjacent thereto.

The first air gaps 700 may be surrounded by the second interlayer insulating film 900. As shown in FIG. 1, the formation of the first air gaps 700 may be limited to the space surrounded by the first coating film 600. Each of the first air gaps 700 may be completely surrounded by the second interlayer insulating film 900, and may be partially in contact with the first coating film 600.

That is, there may occur a case that the second interlayer insulating film 900 cannot be conformally formed along the surface of the first coating film 600 in the space between the first metals 200a, 200b and 200c. In this case, a part of the inner wall of each of the first air gaps 700 may be the first coating film 600, not the second interlayer insulating film 900. The first region (I) in which the first air gaps 700 are formed may have a lower dielectric constant than the second region (II) in which the first air gaps 700 are not formed. The second region (II) may also have a low dielectric constant because it includes the first interlayer insulating film 100 having a low dielectric constant even though it does not include the first air gaps 700. However, since the second region (II) in which the first air gaps 700 are not formed is partially exists, the durability of the entire semiconductor device 1 can be improved.

The area of the first region (I) may be larger than that of the region (II). Since the first region (I) is a region having a relatively low dielectric constant, the parasitic capacitance of the entire semiconductor device 1 can be reduced as the area of the first region (I) increases. In some example embodiments, the first interlayer insulating film 100 may include a low-dielectric-constant film having high durability and a comparatively high k value instead of an ultra-low-dielectric-constant film.

The interval between metal patterns in the first region (I) may be different from the interval between metal patterns in the second region (II). For example, in the first region (I), the first metals 200a, 200b and 200c are spaced apart from each other at first intervals P1, and in the second region (II), the second metals 300a and 300b are spaced apart from each other at a second interval P2. In this case, the first interval P1 may be equal to or smaller than the second interval P2. The first region (I) and the second region (II) may be divided in consideration of the first intervals P1 and the second interval P2. The reference value for discriminating the first region (I) and the second region (II) is not particularly limited. For example, the reference value may be 10 nm to 80 nm, which is not limited thereto.

Hereinafter, a semiconductor device 2 according to an example embodiment of the inventive concepts will be described with reference to FIGS. 3 and 4. Throughout the accompanying drawings, the same reference numerals are used to designate the same or similar components. Therefore, redundant descriptions thereof duplicated with the above descriptions of the semiconductor device 1 in an example embodiment will be omitted or abbreviated.

Figure 3:
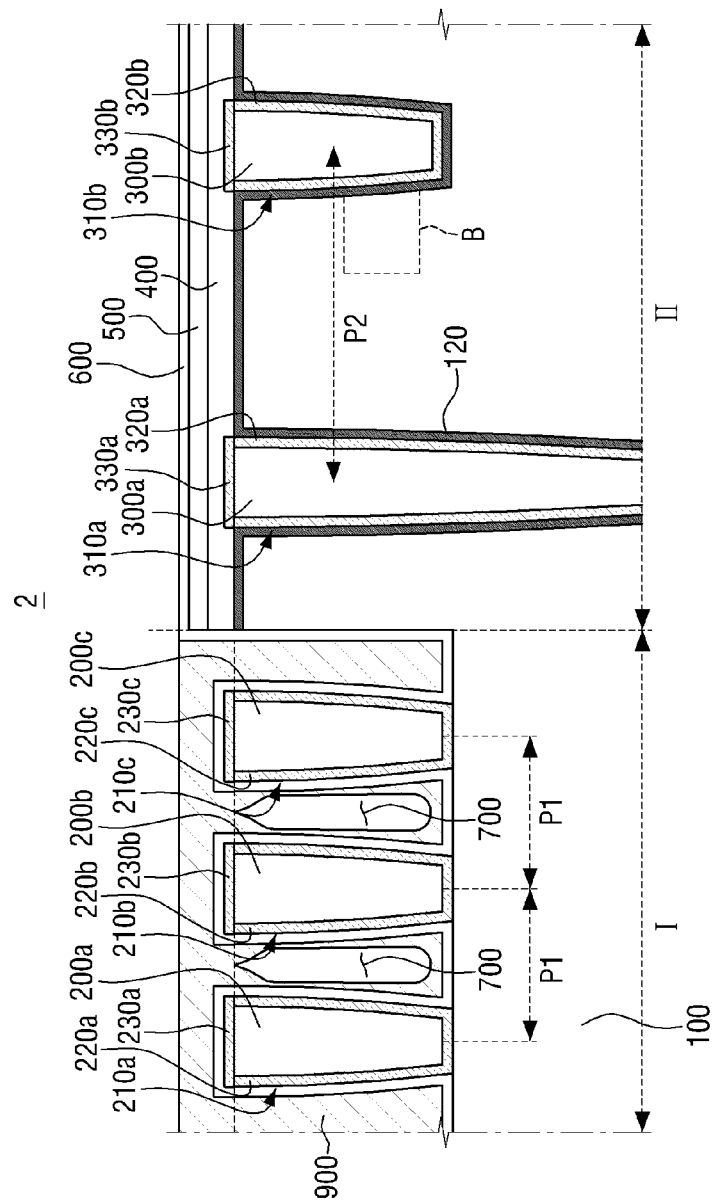
FIG. 3 is a cross-sectional view for explaining a semiconductor device according to an example embodiment of the inventive concepts.
Figure 4:
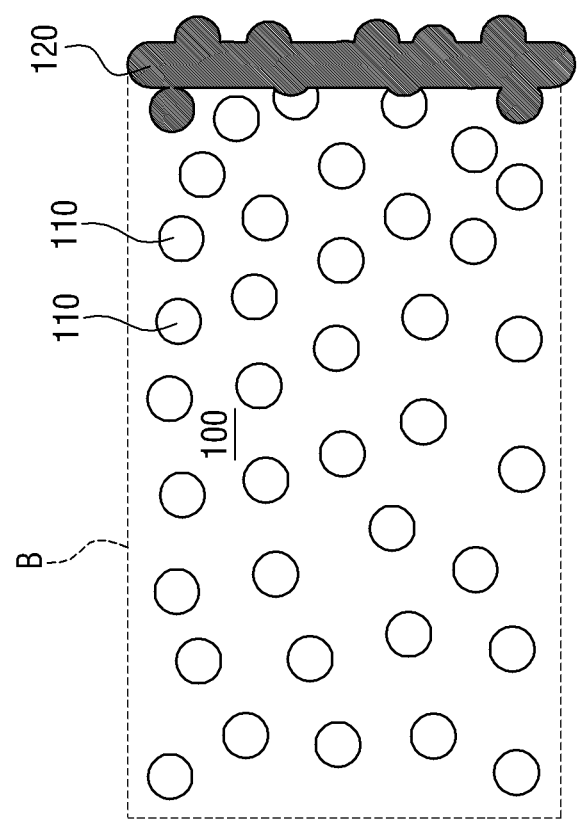
FIG. 4 is an enlarged sectional view of B for explaining a first interlayer insulating film of FIG. 3.

FIG. 3 is a cross-sectional view for explaining the semiconductor device 2 according to an example embodiment of the inventive concepts, and FIG. 4 is an enlarged sectional view of B for explaining a first interlayer insulating film of FIG. 3.

Referring to FIG. 3, the semiconductor device 2 according to an example embodiment of the inventive concepts further includes a sealing film 120.

The sealing film 120 may be formed in the second region (II). The sealing film 120 may not be formed in first region (I). The sealing film 120 may be formed on the surface of the first interlayer insulating film 100. Specifically, the sealing film 120 may be formed on the upper surface of the first interlayer insulating film 100 and the inner walls of the second trenches 310a and 310b formed in the first interlayer insulating film 100. The inner wall of each of the second trenches 310a and 310b refers to a concept including all of the side walls and bottom thereof.

Referring to FIG. 4, the first interlayer insulating film 100 may have a very low dielectric constant because it includes pores 110. These pores 110 serve to lower the dielectric constant of the first interlayer insulating film 100. Therefore, the parasitic capacitance of the semiconductor device 2 can be reduced. However, the modulus, that is, durability of the first interlayer insulating film 100 can be deteriorated by the pores 110. For this reason, the etched surface of the first interlayer insulating film 100 may be damaged by an etching process of forming the first trenches 210a, 210b and 210c and the second trenches 310a and 310b.

Further, in the back end of line (BEOL) process, Cu may be generally used as the second metals 300a and 300b. In this case, Cu may be moved through the pores 110 and damaged cracks even when the second barrier metals 320a and 320b exist. Thus, the fluidity of Cu may cause the deterioration of reliability of the entire semiconductor device 2.

The sealing film 120 can cure the surface of the first interlayer insulating film 100 damaged by an etching process. Further, the sealing film 120 seals the surface of the first interlayer insulating film 100, thereby overcoming the problem of the fluidity of Cu. Therefore, the reliability and durability of the semiconductor device 2 can be improved by the sealing film 120.

Referring to FIG. 3 again, the sealing film 120 may be formed on the upper surface of the first interlayer insulating film 100 in the second region (II) as well as on the inner walls of the second trenches 310a and 310b. This sealing film 120 may be continuously formed over the entire second region (II). In FIG. 3, the sealing film 120 is shown to have a predetermined or desired thickness, but, really, the sealing film 120 may be slightly formed on the surface of the first interlayer insulating film 100.

The sealing film is not formed in the first region (I). However, the sealing film 120 may be etched by the subsequent process after it exists at the time of forming the first trenches 210a, 210b and 210c in the first region (I).

The semiconductor device 2 according to an example embodiment of the inventive concepts can be completed through a pore-sealing process of forming the sealing film 120. The pore-sealing process is a process of curing the damage of the etched surface after forming the first trenches 210a, 210b and 210c and the second trenches 310a and 310b. That is, the pore-sealing process is a process of curing the previously damaged portions later. In contrast, the pore-stuffing process described in an example embodiment is performed before the first trenches 210a, 210b and 210c and the second trenches 310a and 310b are formed. That is, the pore-stuffing process may be a process of reducing or preventing the damages before an etching process.

Both the pore-sealing process and the pore-stuffing process are performed in order to improve the durability of the first interlayer insulating film 100 and improve the reliability of the semiconductor devices 1 and 2. However, the conditions of the pore-sealing process and the conditions of the pore-stuffing process may be different from each other.

Specifically, in the pore-sealing process, the restriction of porosity of the first interlayer insulating film 100 may be stricter than that in the pore-stuffing process. In the pore-stuffing process described in an example embodiment, a porous low-dielectric-constant film having a porosity of about 0% to 80% under the same conditions can be used. In contrast, in the pore-sealing process in an example embodiment, a porous low-dielectric-constant film having a porosity of 0% to 60% under the same conditions can be used. However, the above values may be changed depending on process conditions. These values are values exemplified for explaining the relative difference between both the processes.

That is, the porosity of the first interlayer insulating film 100 in the semiconductor device 2 according to an example embodiment of the inventive concepts may be 0% to 60%. Therefore, the first interlayer insulating film 100 of the semiconductor device 2 in an example embodiment may have a higher dielectric constant than the first interlayer insulating film 100 of the semiconductor device 1 in an example embodiment. However, the first interlayer insulating film 100 of the semiconductor device 2 in an example embodiment has a relatively high dielectric constant compared to that of the first interlayer insulating film 100 of the semiconductor device 1 in an example embodiment, but may still have a low k value of 3.00 or less. That is, the first interlayer insulating film 100 of the semiconductor device 2 in an example embodiment may still have a low dielectric constant.

The sealing film 120 may be formed using a bulky precursor. The precursor may include at least one of octamethyl cyclotetrasiloxane and hexamethyl cyclotrisilazane, which is not limited thereto.

Hereinafter, a semiconductor device 3 according to an example embodiment of the inventive concepts will be described with reference to FIG. 5. Throughout the accompanying drawings, the same reference numerals are used to designate the same or similar components. Therefore, redundant descriptions thereof duplicated with the above descriptions of the semiconductor devices 1 and 2 in the first and second example embodiments will be omitted or abbreviated.

Figure 5:
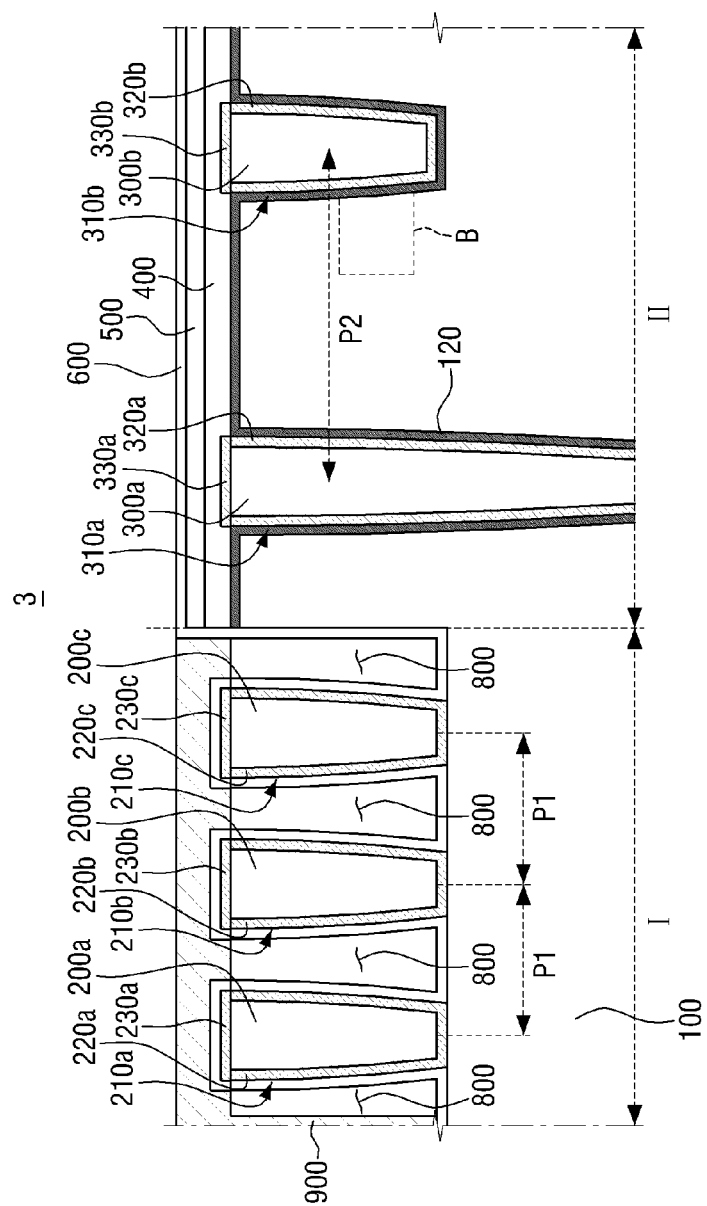
FIG. 5 is a cross-sectional view for explaining a semiconductor device according to an example embodiment of the inventive concepts.

FIG. 5 is a cross-sectional view for explaining the semiconductor device 3 according to an example embodiment of the inventive concepts. Referring to FIG. 5, the semiconductor device 3 according to an example embodiment of the inventive concepts includes second air gaps 800 instead of the first air gaps 700 of FIG. 1.

The second air gaps 800 may be formed at the lateral sides of the first metals 200a, 200b and 200c. The second air gaps 800, unlike the first air gaps 700, may be formed even at the lateral sides of the first metals 200a, 200b and 200c, not between the first metals 200a, 200b and 200c. The sites at which the second air gaps 800 are to be formed can be previously determined in the previous process using a sacrificial film. Therefore, the second air gaps 800 can be formed by removing the sacrificial film.

The second air gaps 800 may be surrounded by the first coating film 600. The upper portions of the second air gaps 800 may be sealed by the second interlayer insulating film 900. The lateral sides of the second air gaps 800 may be the second interlayer insulating film 900, not the coating film 600, depending on the position of the sacrificial film. That is, the lateral sides of the second air gaps 800 may be in contact with the second interlayer insulating film 900.

The semiconductor device 3 according to an example embodiment of the inventive concepts may have the second air gaps 200 larger than the first air gaps 700 (FIGS. 1 and 3) of the above-described semiconductor devices 1 and 2 according to the first and second example embodiments. Furthermore, the second air gaps 200 can be formed at desired positions in desired volumes. Therefore, the dielectric constant of the second interlayer insulating film 900 can be lowered. Thus, the parasitic capacitance of the semiconductor device 3 according to an example embodiment of the inventive concepts can be further reduced.

Hereinafter, a semiconductor device 4 according to an example embodiment of the inventive concepts will be described with reference to FIG. 6. Throughout the accompanying drawings, the same reference numerals are used to designate the same or similar components. Therefore, redundant descriptions thereof duplicated with the above descriptions of the semiconductor devices 1, 2 and 3 in the first, second and third example embodiments will be omitted or abbreviated.

Figure 6:
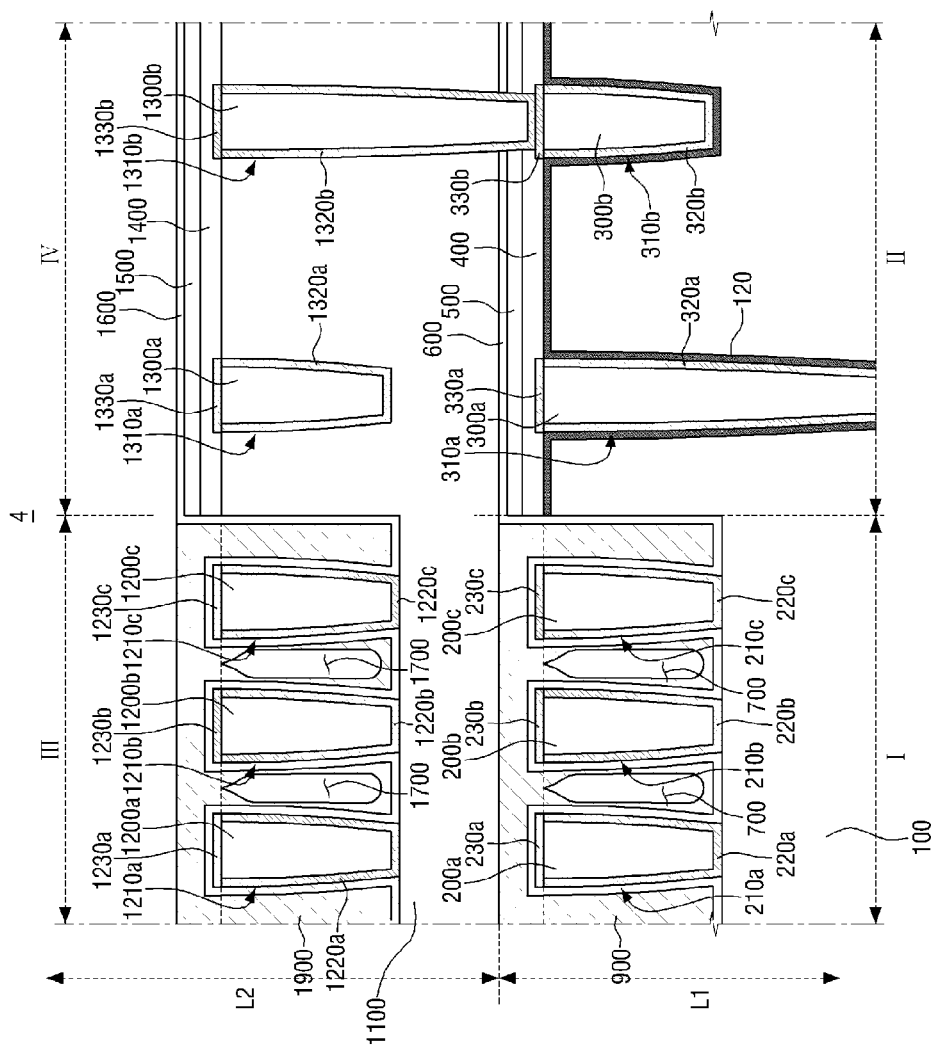
FIG. 6 is a cross-sectional view for explaining a semiconductor device according to an example embodiment of the inventive concepts.

FIG. 6 is a cross-sectional view for explaining the semiconductor device 4 according to an example embodiment of the present inventive concepts.

Referring to FIG. 6, the semiconductor device 4 according to an example embodiment of the inventive concepts may include a plurality of levels. That is, the semiconductor device 4 according to an example embodiment of the inventive concepts having a multi-level wiring structure includes a first level (L1) and a second level (L2).

The first level (L1) is substantially identical with the semiconductor device 2 according to an example embodiment of the inventive concepts. That is, the first level (L1) includes the first region (I), the second region (II), and the sealing film 120.

The second level (L2) may be formed on the first level (L1). The second level (L2) may include a wiring structure and a via structure which are different from those of the first level (L1). The second level (L2) includes a third region (III) and a fourth region (IV). The third region (III) and the fourth region (IV) may correspond to the first region (I) of FIG. 1 and the second region (II) of FIG. 1, respectively.

The second level (L2) includes a third interlayer insulating film 1100, third trenches 1210a, 1210b and 1210c, fourth trenches 1310a and 1310b, third metals 1200a, 1200b and 1200c, fourth metals 1300a and 1300b, third barrier metals 1220a, 1220b and 1220c, fourth barrier metals 1320a and 1320b, third capping films 1230a, 1230b and 1230c, fourth capping films 1330a and 1330b, a fourth interlayer insulating film 1900, a second intermediate film 1400, a second mask film 1500, a second coating film 1600, and third air gaps 1700.

The third interlayer insulating film 1100, similarly to the first interlayer insulating film 100, may include a silicon oxide film. The third interlayer insulating film 1100 may be a porous silicon oxide film. That is, the third interlayer insulating film 1100 may be a porous film made of p-Si—OCH (porous-Si—OCH).

The third interlayer insulating film 1100 may include a third region (III) and a fourth region (IV). The height of upper surface of the third interlayer insulating film 1100 in the third region (III) may be lower than the height of upper surface of the third interlayer insulating film 1100 in the fourth region (IV). That is, the third interlayer insulating film 1100 may include the selectively etched third region (III) and the non-etched or relatively less etched fourth region (IV).

The fourth interlayer insulating film 1900 may be formed on the third interlayer insulating film 1100. The fourth interlayer insulating film 1900 may be formed on the third region (III) of the third interlayer insulating film 1100. That is, when the third interlayer insulating film 1100 is selectively etched, the fourth interlayer insulating film 1900 may be formed on the etched portion of the third interlayer insulating film 1100. Therefore, the upper surface of the fourth interlayer insulating film 1900 may be coplanar with the upper surface of the third interlayer insulating film 1100 in the fourth region (IV).

The fourth interlayer insulating film 1900 may include at least one of silicon oxide, silicon nitride, and silicon oxynitride. Furthermore, the fourth interlayer insulating film 1900 may include the same material as the third interlayer insulating film 1100, which is not limited thereto.

The third trenches 1210a, 1210b and 1210c may be formed in the fourth interlayer insulating film 1900. The third trenches 1210a, 1210b and 1210c may be provided therein with third metals 1200a, 1200b and 1200c, respectively. Specifically, the third trenches 1210a, 1210b and 1210c may be provided therein with conformal third barrier metals 1220a, 1220b and 1220c and third metals 1200a, 1200b and 1200c, respectively. The third barrier metals 1220a, 1220b and 1220c may be conformally formed along the inner walls of the third trenches 1210a, 1210b and 1210c, respectively, and the third metals 1200a, 1200b and 1200c can completely fill the third trenches 1210a, 1210b and 1210c, respectively.

Each of the third trenches 1210a, 1210b and 1210c may have a vertical shape, but, as shown in FIG. 6, may have a shape in which the width of the lower portion thereof is narrower than that of the upper portion thereof, which is not limited thereto. The bottom of each of the third trenches 1210a, 1210b and 1210c may be the third interlayer insulating film 1100, which is not limited thereto. The third trenches 1210a, 1210b and 1210c may also be formed to penetrate the third interlayer insulating film 1100. When the bottom of each of the third trenches 1210a, 1210b and 1210c is the third interlayer insulating film 1100, the third trenches 1210a, 1210b and 1210c form a linear wiring structure. When the third trenches 1210a, 1210b and 1210c penetrate the third interlayer insulating film 1100, the third trenches 1210a, 1210b and 1210c form a via structure in which wirings of different levels are vertically connected to each other. That is, the third trenches 1210a, 1210b and 1210c may be formed into a wiring structure or a via structure. A plurality of third trenches 1210a, 1210b and 1210c may be formed. Therefore, some of the third trenches 1210a, 1210b and 1210c may be formed into a wiring structure, and others thereof may be formed into a via structure.

The fourth trenches 1310a and 1310b may be formed in the third interlayer insulating film 1100. The fourth trenches 1310a and 1310b may be provided therein with fourth metals 1300a and 1300b, respectively. Specifically, the fourth trenches 1310a and 1310b may be provided therein with conformal fourth barrier metals 1320a and 1320b and fourth metals 1300a and 1300b, respectively. The fourth barrier metals 1320a and 1320b may be conformally formed along the inner walls of the fourth trenches 1310a and 1310b, respectively, and the fourth metals 1300a and 1300b can completely fill the fourth trenches 1310a and 1310b, respectively.

Each of the fourth trenches 1310a and 1310b may have a vertical shape, but, as shown in FIG. 6, may have a shape in which the width of the lower portion thereof is narrower than that of the upper portion thereof, which is not limited thereto. The bottom of each of the fourth trenches 1310a and 1310b may be the third interlayer insulating film 1100, which is not limited thereto. The fourth trenches 1310a and 1310b may also be formed to penetrate the third interlayer insulating film 1100. As shown in FIG. 6, the fourth trench 1310b located at the right side in the fourth region (IV) may penetrate the third interlayer insulating film 1100 to be in contact with the second capping film 330b formed on the second metal 300b of the first level (L1). However, the positions of the right fourth trench 1310b and the second metal 300b being in contact therewith are only illustrative, and are not limited thereto. That is, any one of the fourth metals 1300a and 1300b may also be electrically connected to any one of the second metals 300a and 300b and the first metals 200a, 200b and 200c.

The third barrier metals 1220a, 1220b and 1220c may be formed in the third trenches 1210a, 1210b and 1210c, respectively. The third barrier metals 1220a, 1220b and 1220c may be conformally formed on the inner walls of the third trenches 1210a, 1210b and 1210c, respectively. Specifically, the third barrier metals 1220a, 1220b and 1220c may be conformally formed on the side walls and bottom surfaces of the third trenches 1210a, 1210b and 1210c, respectively. Each of the third barrier metals 1220a, 1220b and 1220c may be formed between each of the third metals 1200a, 1200b and 1200c and the third and fourth interlayer insulating films 1100 and 1900.

The fourth barrier metals 1320a and 1320b may be formed in the fourth trenches 1310a and 1310b, respectively. The fourth barrier metals 1320a and 1320b may be conformally formed on the inner walls of the fourth trenches 1310a and 1310b, respectively. Specifically, the fourth barrier metals 1320a and 1320b may be conformally formed on the side walls and bottom surfaces of the fourth trenches 1310a and 1310b, respectively. Each of the fourth barrier metals 1320a and 320b may be formed between each of the fourth metals 1300a and 1300b and the third interlayer insulating film 1100.

The third metals 1200a, 1200b and 1200c can fill the third trenches 1210a, 1210b and 1210c, respectively. The third metals 1200a, 1200b and 1200c may be formed on the third barrier metals 1220a, 1220b and 1220c formed on the inner walls of the third trenches 1210a, 1210b and 1210c, respectively. The third metals 1200a, 1200b and 1200c can completely fill the third trenches 1210a, 1210b and 1210c, respectively. Each of the third metals 1200a, 1200b and 1200c may include a metal constituting a wiring or via. Specifically, each of the third metals 1200a, 1200b and 1200c may include Cu, W, Co, and/or Al, which is not limited thereto.

The fourth metals 1300a and 1300b can fill the fourth trenches 1310a and 1310b, respectively. The fourth metals 1300a and 1300b may be formed on the fourth barrier metals 1320a and 1320b formed on the inner walls of the fourth trenches 1310a and 1310b, respectively. The fourth metals 1300a and 1300b can completely fill the fourth trenches 1310a and 1310b, respectively. Each of the fourth metals 1300a and 1300b may include a metal constituting a wiring or via. Specifically, each of the fourth metals 1300a and 1300b may include Cu, Co, and/or Al, which is not limited thereto. The fourth metals 1300a and 1300b and the third metals 1200a, 1200b and 1200c may be simultaneously formed. Furthermore, the upper surface of each of the third metals 1200a, 1200b and 1200c may be coplanar with the upper surface of each of the fourth metals 1300a and 1300b.

The third capping films 1230a, 1230b and 1230c can cap the third trenches 1210a, 1210b and 1210c, respectively. The third capping films 1230a, 1230b and 1230c may be formed on the third metals 1200a, 1200b and 1200c in the third trenches 1210a, 1210b and 1210c, respectively. Each of the third capping films 1230a, 1230b and 1230c may include a conductor. For example, each of the third capping films 1230a, 1230b and 1230c may contain Co and/or AlN, which is not limited thereto. The third capping films 1230a, 1230b and 1230c are formed in the third trenches 1210a, 1210b and 1210c, respectively, and are not formed when the third trenches 1210a, 1210b and 1210c are not formed. That is, a plurality of the third capping films 1230a, 1230b and 1230c may also be formed corresponding to a plurality of the third trenches 1210a, 1210b and 1210c.

The fourth capping films 1330a and 1330b can cap the fourth trenches 1310a and 1310b, respectively. The fourth capping films 1330a and 1330b may be formed on the fourth metals 1300a and 1300b in the fourth trenches 1310a and 1310b, respectively. Each of the fourth capping films 1330a and 1330b may include a conductor. For example, each of the fourth capping films 1330a and 1330b may include Co and/or AlN, which is not limited thereto. The fourth capping films 1330a and 1330b are formed in the fourth trenches 1310a and 1310b, respectively, and are not formed when the fourth trenches 1310a and 1310b are not formed. That is, a plurality of the fourth capping films 1330a and 1330b may also be formed corresponding to a plurality of the fourth trenches 1310a and 1310b.

The second intermediate film 1400 may be formed in the fourth region (IV). The second intermediate film 1400 may be formed on the fourth capping films 1330a and 1330b and the third interlayer insulating film 1100 in the fourth region (IV). The second intermediate film 1400 may be formed relatively thinly compared to the third interlayer insulating film 1100. The second intermediate film 1400 may be made of silicon nitride, for example, SiCN, which is not limited thereto. The second intermediate film 1400 may also be made of SiOC.

The second mask film 1500 may be formed in the fourth region (IV). The second mask film 1500 may be formed on the second intermediate film 1400 in the fourth region (IV). The second mask film 1500 may be formed relatively thinly compared to the third interlayer insulating film 1100. The etch rate of the second mask film 1500 may be lower than that of the third interlayer insulating film 1100. The second mask film 1500 may be made of silicon nitride, for example, SiON, which is not limited thereto. The second mask film 1500 may serve to allow the fourth region (IV) not to be etched while the third region (III) is etched.

The second coating film 1600 may be formed in both the third region (III) and the fourth region (IV). In the third region (III), the second coating film 1600 may be formed on the third interlayer insulating film 1100, the third barrier metals 1220a, 1220b and 1220c, and the third capping films 1230a, 1230b and 1230c. The second coating film 1600 may be formed beneath the fourth interlayer insulating film 1900 and the third air gaps 1700.

Specifically, in the third region (III), the second coating film 1600 may be formed on the upper surface of the third interlayer insulating film 1100, which is not overlapped with the third metals 1200a, 1200b and 1200c and the third barrier metals 1220a, 1220b and 1220c. Moreover, the second coating film 1600 may be formed along the outer walls of the third barrier metals 1220a, 1220b and 1220c.

Since the upper surfaces of the third metals 1200a, 1200b and 1200c are respectively capped by the third capping films 1230a, 1230b and 1230c, the second coating film 1600 may be formed along the upper surfaces of the third capping films 1230a, 1230b and 1230c. That is, the second coating film 1600 may be conformally formed along the surfaces of the third interlayer insulating film 1100, the third barrier metals 1220a, 1220b and 1220c, and third capping films 1230a, 1230b and 1230c.

In the fourth region (IV), the second coating film 1600 may be formed on the upper surface of the second mask film 1500. The second coating film 1600 may be formed on the recessed lateral side of the third interlayer insulating film 1100, by which the third interlayer insulating film 1100 is divided into the third region (III) and the fourth region (IV), as well as on the upper surface of the second mask film 1500. That is, the second intermediate film 1400, the second mask film 1500, and the third interlayer insulating film 1100 may have a coplanar etched surface, and the second coating film 1600 may be formed along the etched surface. In other words, the second coating film 1600 may be formed in the shape entirely extending in the third region (III) and the fourth region (IV).

The third air gaps 1700 may be formed at the lateral sides of the third metals 1200a, 1200b and 1200c. The third air gap 1700 may be formed at the lateral side of each of a plurality of the third metals 1200a, 1200b and 1200c. The third air gaps 1700 may be formed between the plurality of the third metals 1200a, 1200b and 1200c, but are not limited thereto. The third air gaps 1700 may be filled with air. Since air is a material having a very low dielectric constant k, when the third air gaps 1700 are formed in the fourth interlayer insulating film 1900, the parasitic capacitance of the fourth interlayer insulating film 1900 is reduced. Therefore, the reliability of the semiconductor device 4 can be improved.

The third air gaps 1700 may be formed by the deposition of the fourth interlayer insulating film 1900 having poor step coverage. The third air gaps 1700 may be surrounded by the fourth interlayer insulating film 1900. As shown in FIG. 6, the formation of the third air gaps 1700 may be limited to the space surrounded by the second coating film 1600. Each of the third air gaps 1700 may be completely surrounded by the fourth interlayer insulating film 1900, and may be partially in contact with the second coating film 1600.

That is, there may occur a case that the fourth interlayer insulating film 1900 cannot be conformally formed along the surface of the second coating film 1600 in the space between the third metals 1200a, 1200b and 1200c. In this case, a part of the inner wall of each of the third air gaps 1700 may be the second coating film 1600, not the fourth interlayer insulating film 1900.

That is, the semiconductor device 4 according to an example embodiment of the inventive concepts may have a structure in which the semiconductor device 1 according to an example embodiment of the inventive concepts and the semiconductor device 2 according to an example embodiment of the inventive concepts are sequentially laminated. In other words, the first level (L1) may include the semiconductor device 2 according to an example embodiment of the inventive concepts, and the second level (L2) may include the semiconductor device 1 according to an example embodiment of the inventive concepts.

In this case, the semiconductor device of the first level (L1) may include the sealing film 120 through a pore-sealing process, and the semiconductor device of the second level (L2) may include the third interlayer insulating film 110 through a pore-stuffing process. That is, the dielectric constant of the first interlayer insulating film 100 may be different from that of the third interlayer insulating film 1100. Specifically, since a film having a lower dielectric constant can be effectively used in performing the pore-stuffing process, the dielectric constant of the third interlayer insulating film 1100 of the second level (L2) may be lower than that of the first interlayer insulating film 100 of the first level (L1), which is not limited thereto. The dielectric constant of the first interlayer insulating film 100 may be equal to that of the third interlayer insulating film 1100. That is, the first interlayer insulating film 100 and the third interlayer insulating film 1100 may contain the first and second porous ultra-low-dielectric-constant materials, respectively. The dielectric constant of each of the first and second porous ultra-low-dielectric-constant materials may be lowered with the increase in the porosity thereof. The porosity of the first porous ultra-low-dielectric-constant material may be different from that of the second porous ultra-low-dielectric-constant material. Specifically, the porosity of the first porous ultra-low-dielectric-constant material may be less than that of the second porous ultra-low-dielectric-constant material. That is, since the pore-stuffing process can be performed using a material having greater porosity compared to the pore-sealing process, the porosity of the second porous ultra-low dielectric-constant material of the third interlayer insulating film 1100 used in the pore-stuffing process may be greater than that of the first porous ultra-low dielectric-constant material of the first interlayer insulating film 100 used in the pore-sealing process, which is not limited thereto. The porosity of the second porous ultra-low dielectric-constant material may be equal to that of the first porous ultra-low dielectric-constant material.

Further, the semiconductor device 1 according to an example embodiment of the inventive concepts is not always located at the second level (L2). That is, the positions of the semiconductor devices of the first level (L1) and the second level (L2) in FIG. 6 may be changed each other. Further, the semiconductor device 3 according to an example embodiment of the inventive concepts may also be applied to the first level (L1) or the second level (L2), or to the first level (L1) and the second level (L2).

In other words, the multi-level semiconductor device 4 according to an example embodiment of the inventive concepts may include all cases that interlayer insulating films having different dielectric constants from each other exist with respect to each level.

Hereinafter, a method of manufacturing the semiconductor device 1 according to an example embodiment of the inventive concepts will be described with reference to FIGS. 1 and 7 to 23. Throughout the accompanying drawings, the same reference numerals are used to designate the same or similar components. Therefore, redundant descriptions thereof duplicated with the above descriptions of the semiconductor device 1 in an example embodiment will be omitted or abbreviated.

Figure 7:
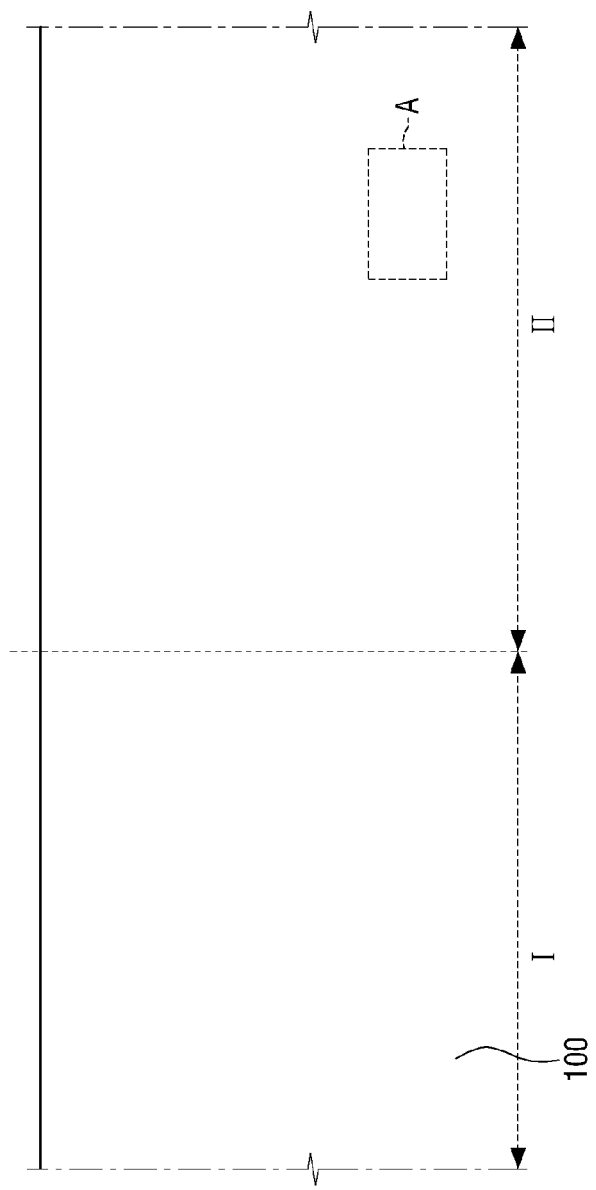
FIGS. 7 to 23 are intermediate views for explaining a method of manufacturing a semiconductor device according to a first example embodiment of the inventive concepts.
Figure 8:
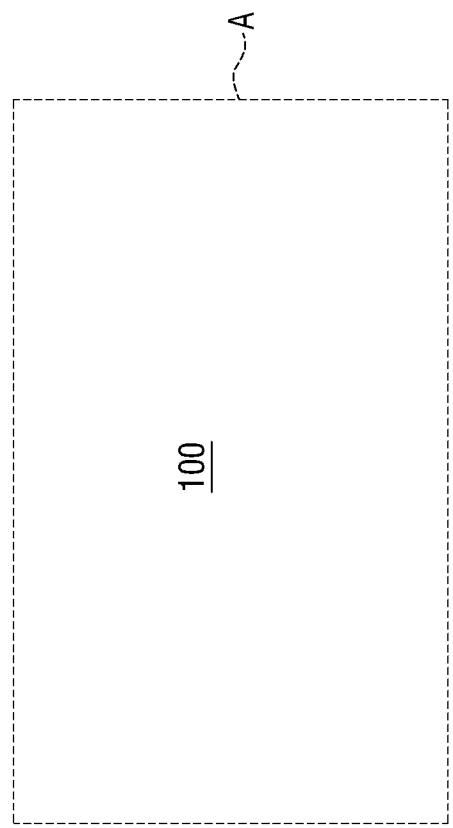
Figure 9:
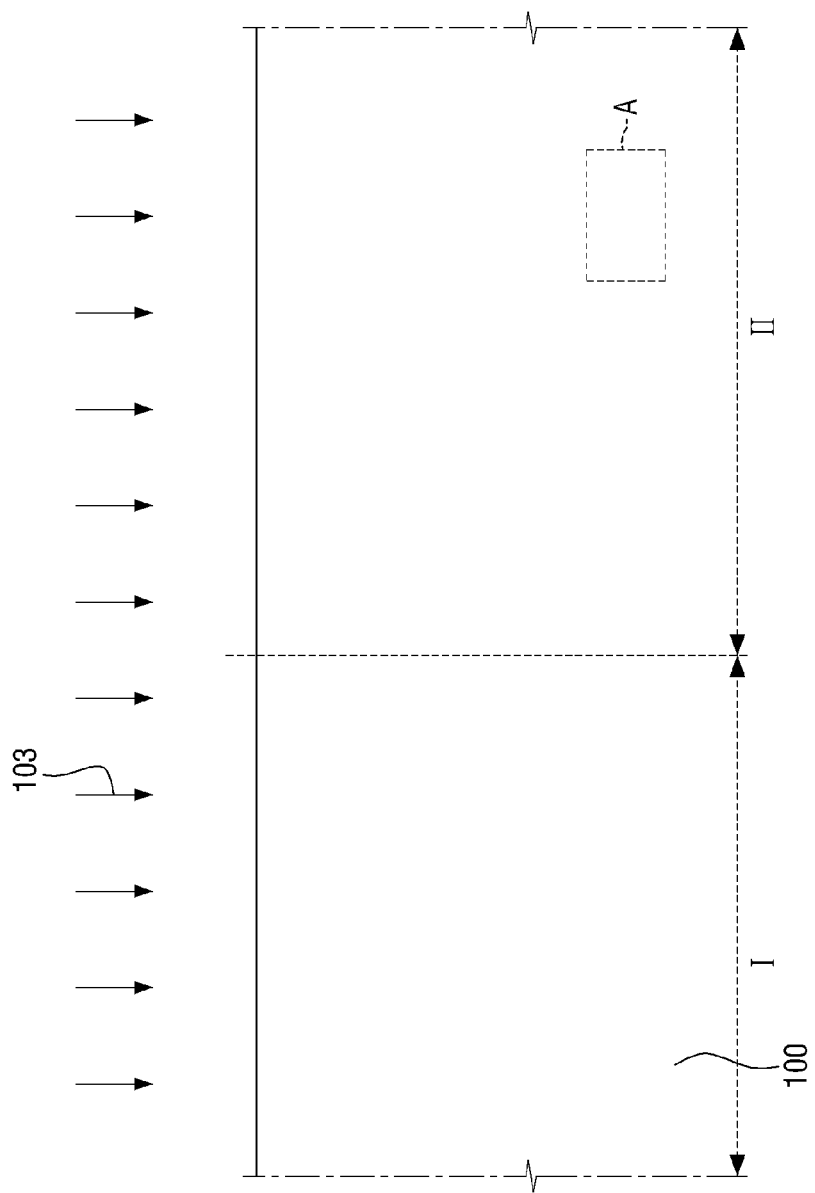
Figure 10:
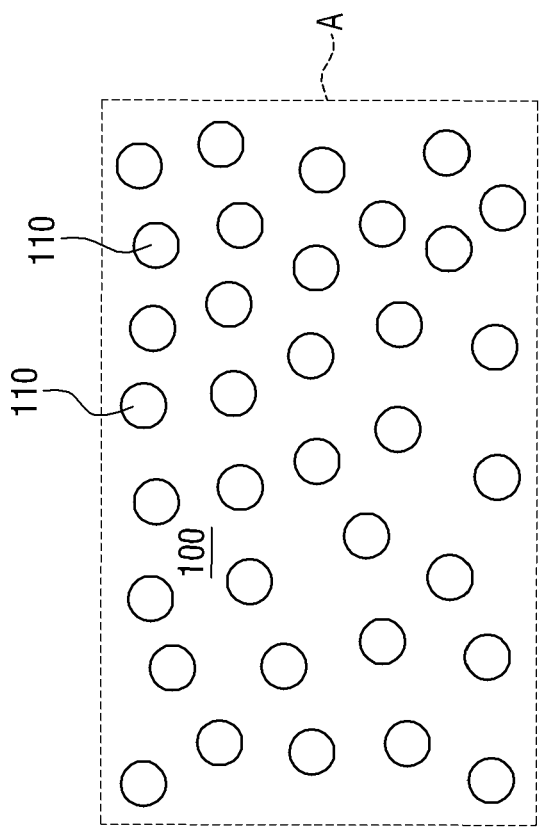
Figure 11:
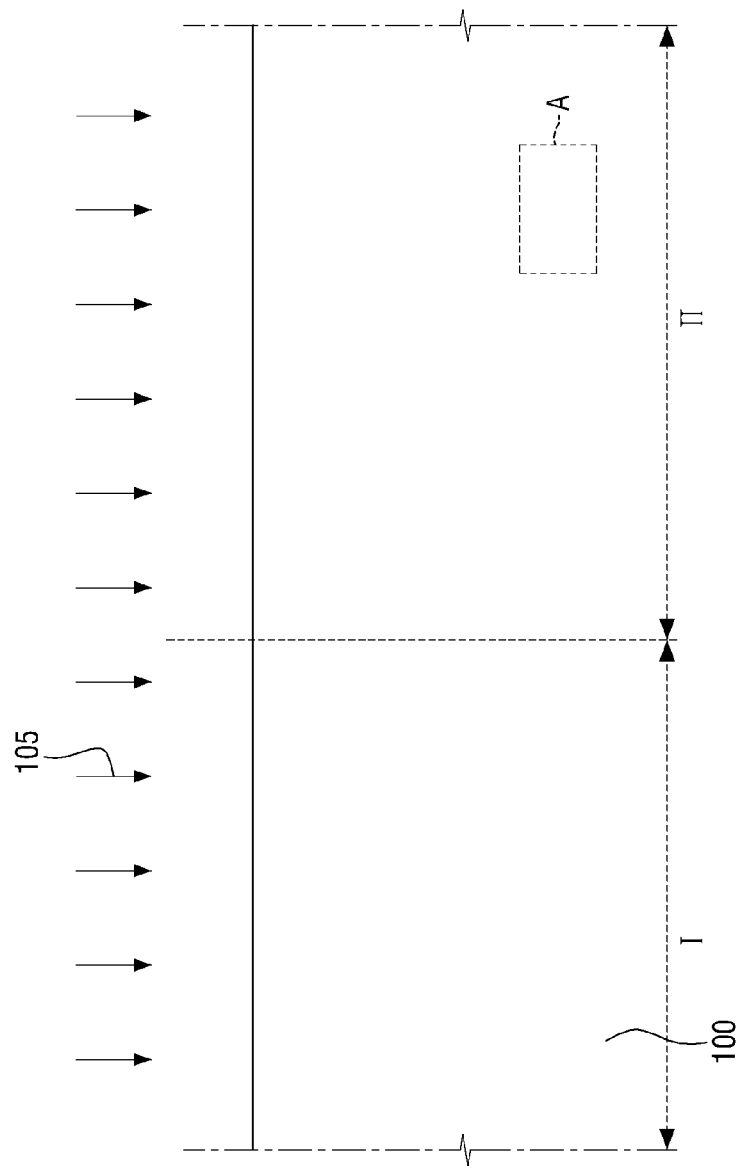
Figure 12:
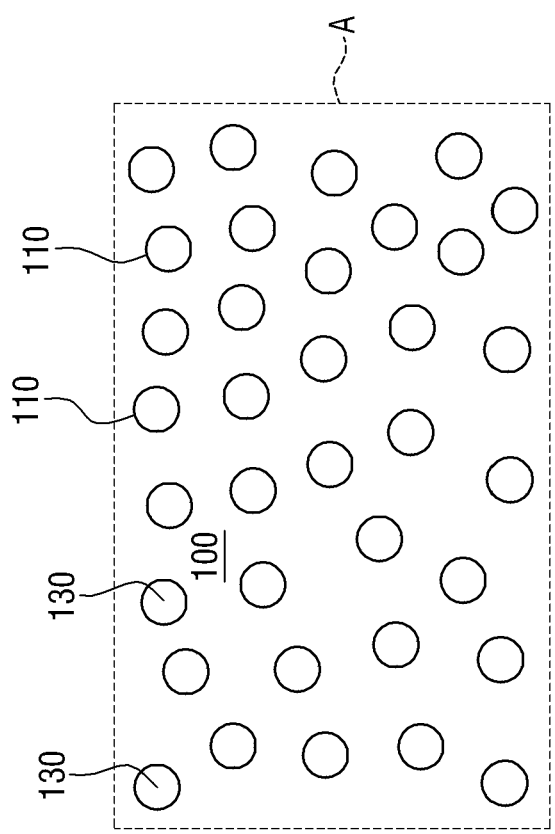

FIGS. 7 to 23 are intermediate views for explaining a method of manufacturing the semiconductor device 1 according to an example embodiment of the inventive concepts, FIG. 8 is an enlarged sectional view for explaining A in FIG. 7, FIG. 10 is an enlarged sectional view for explaining A in FIG. 9, and FIG. 12 is an enlarged sectional view for explaining A in FIG. 11.

Referring to FIGS. 7 and 8, a first interlayer insulating film 100 is formed. The first interlayer insulating film 100 may include a first region (I) and a second region (II). The first region (I) is a region in which first air gaps 700 will be formed later, and the second region (II) is a region in which first air gaps 700 will not be formed even later.

Referring to FIG. 8, pores 110 (FIG. 10) are not formed yet in the first interlayer insulating film 100. Therefore, the dielectric constant of this first interlayer insulating film 100 may be greater than that of the first interlayer insulating film 100 in which pores 110 (FIG. 10) will be formed later.

Referring to FIGS. 9 and 10, pores 110 are formed in the first interlayer insulating film 100 using ultraviolet (UV) 103 or heat. The entire first interlayer insulating film 100 may be irradiated with ultraviolet (UV). The ultraviolet 103 may be applied to the surface of the first interlayer insulating film 100 to be absorbed in the first interlayer insulating film 100. Thus, a plurality of pores 110 may be formed in the first interlayer insulating film 100. The dielectric constant of the first interlayer insulating film 100 is less by the formation of the plurality of pores 110.

Referring to FIGS. 11 and 12, a pore stuffing process 105 is performed with respect to the first interlayer insulating film 100. The pore stuffing process is a process of filling the pores 110 with a first material 130. As the first material 130, any material may be used as long as it can fill the pores 110. As the first material 130, a material having a wide range of molecular weight may be considered. For example, the first material 130 may be a polymer.

The first material 130 must be a material which can be removed later. The first material 130 (thermally degradable material) can be removed by heat. The first material (solvent-degradable material) can also be removed by a chemical solution.

The porosity of the first interlayer insulating film 100 during the pore stuffing process 105 may be 0% to 80%. The pore stuffing process 105 can be used in an interlayer insulating film having greater porosity than the interlayer insulating film which is subjected to a pore sealing process.

The pores 110 serve to lower the dielectric constant of the first interlayer insulating film 100. However, due to the pores 110, the durability of the first interlayer insulating film 100 may be deteriorated, and the first interlayer insulating film 100 may be damaged by etching.

When the first interlayer insulating film 100 is damaged, a phenomenon in which first metals 200a, 200b and 200c are discharged may occur. Therefore, in order to reduce or prevent this phenomenon, the pores 110 are filled with the first material 130 to improve the durability of the first interlayer insulating film 100, thereby reducing or preventing the damage of the first interlayer insulating film 100 due to an etching process.

Figure 13:
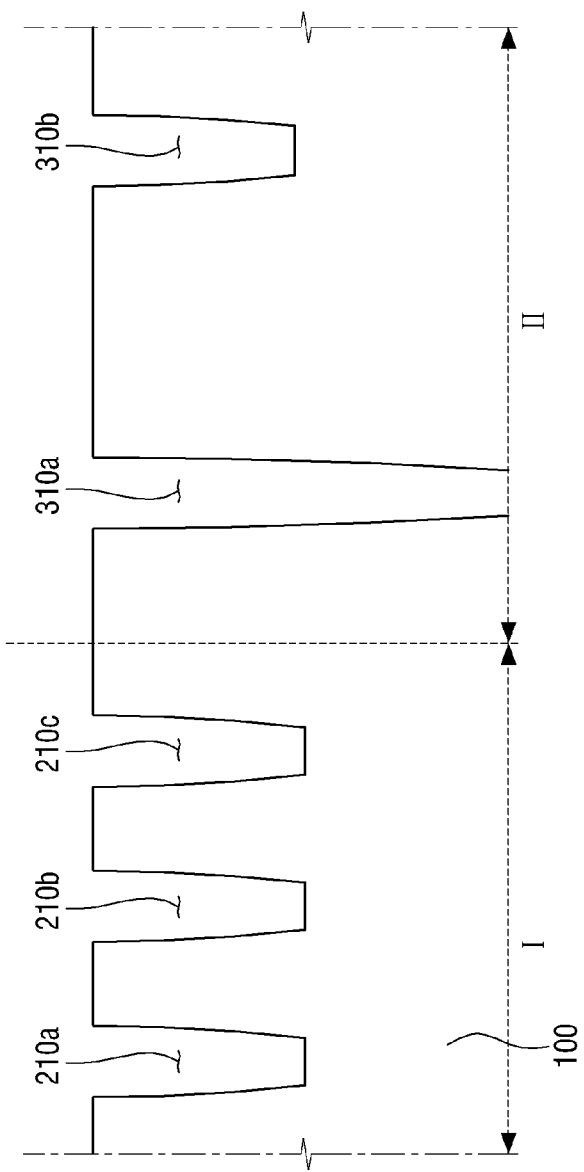

Referring to FIG. 13, first trenches 210a, 210b and 210c and second trenches 310a and 310b may be formed. The first trenches 210a, 210b and 210c may be formed in the first region (I). The second trenches 310a and 310b may be formed in the second region (II). A plurality of first trenches 210a, 210b and 210c and a plurality of second trenches 310a and 310b may be formed. The interval between the plurality of first trenches 210a, 210b and 210c may be equal to or narrower than the interval between the plurality of second trenches 310a and 310b. The first region (I) and the second region (II) can be defined by determining the relationship between the intervals and the predetermined or desired reference values. The first region (I) may be larger than the second region (II).

The first trenches 210a, 210b and 210c and the second trenches 310a and 310b may penetrate the first interlayer insulating film 100, or may not penetrate the first interlayer insulating film 100. It is shown in FIG. 13 that only the second trench 310a penetrates the first interlayer insulating film 100. However, this is only an example, and the first trenches 210a, 210b and 210c may also penetrate the first interlayer insulating film 100. When the first trenches 210a, 210b and 210c and the second trenches 310a and 310b do not penetrate the first interlayer insulating film 100, a wiring structure may be formed. Further, when the first trenches 210a, 210b and 210c and the second trenches 310a and 310b penetrate the first interlayer insulating film 100, a via structure may be formed.

Figure 14:
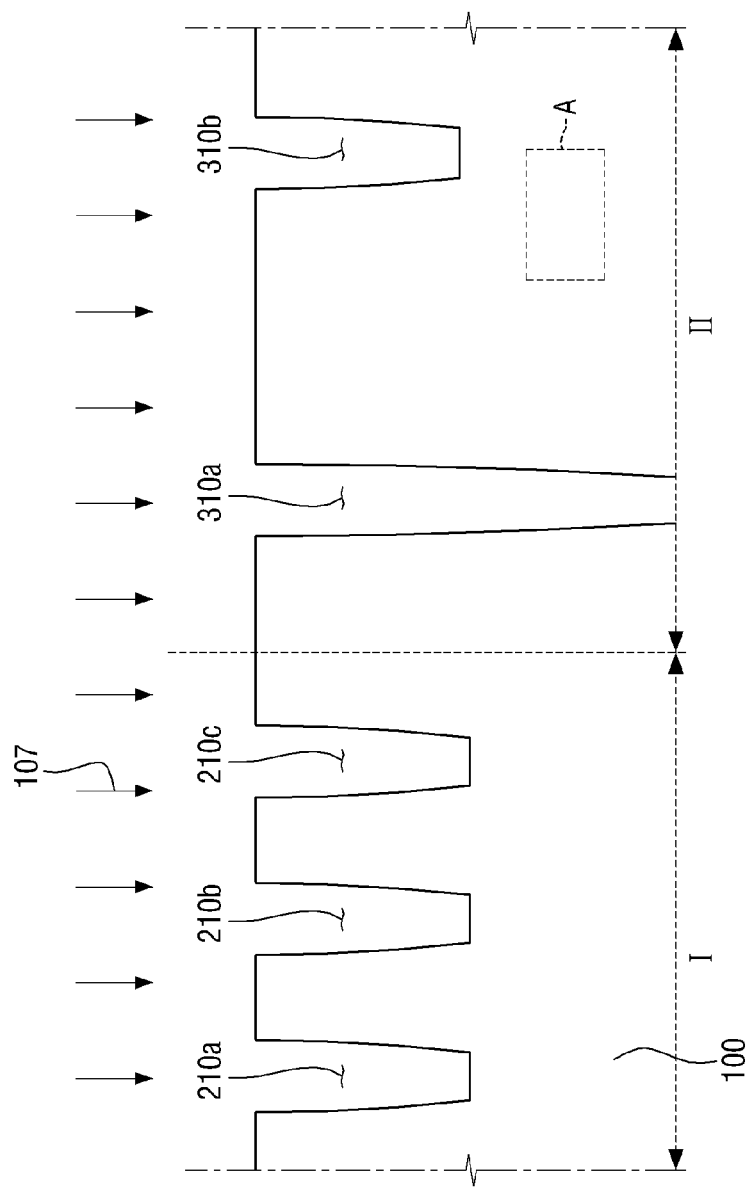

Referring to FIGS. 10 and 14, a removal process 107 is performed with respect to the first interlayer insulating film 100. The removal process 107 is a process of removing the first material 130 filling the pores 110. The removal of the first material may be performed by various methods. The removal process may be a process of removing the first material 130 using heat or a process of removing the first material 130 using a chemical solution.

As such, when the first material 130 is removed from the pores 110 in the first interlayer insulating film 100, the first interlayer insulating film 100 may have pores 110 filled with air. Therefore, the first interlayer insulating film 100 can maintain a low dielectric constant again. That is, in the first interlayer insulating film 100, the pores 110 is filled with the first material 130 in order to reduce or prevent the first interlayer insulating film 100 from being damaged by an etching process, and then the first material 130 is removed, thereby allowing the first interlayer insulating film 100 to maintain a low dielectric constant.

Figure 15:
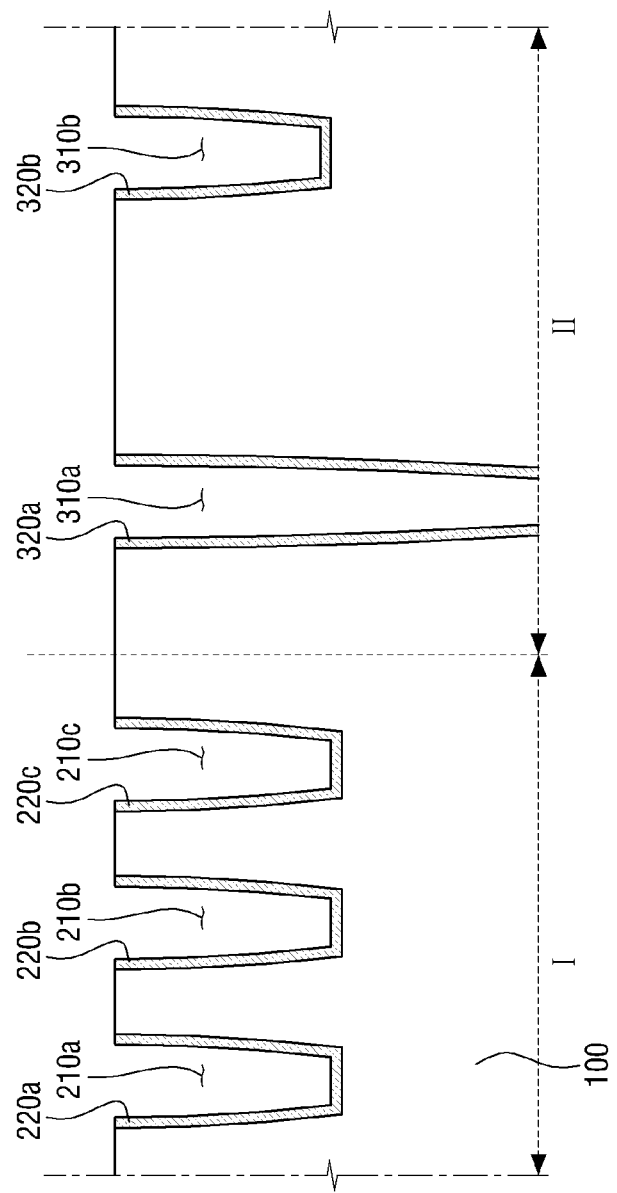

Referring to FIG. 15, first barrier metals 220a, 220b and 220c and second barrier metals 320a and 320b are formed in the first trenches 210a, 210b and 210c and the second trenches 310a and 310b, respectively. The first barrier metals 220a, 220b and 220c and the second barrier metals 320a and 320b may be conformally formed on the inner walls of the first trenches 210a, 210b and 210c and the second trenches 310a and 310b, respectively. The inner wall is a concept including all side walls and a bottom.

The first trenches 210a, 210b and 210c and the second trenches 310a and 310b may not be completely filled with the first barrier metals 220a, 220b and 220c and the second barrier metals 320a and 320b. The first barrier metals 220a, 220b and 220c and the second barrier metals 320a and 320b are formed to completely cover the first interlayer insulating film 100, and are then separated to be located on only the respective inner walls of first trenches 210a, 210b and 210c and the second trenches 310a and 310b by an etching process.

Figure 16:
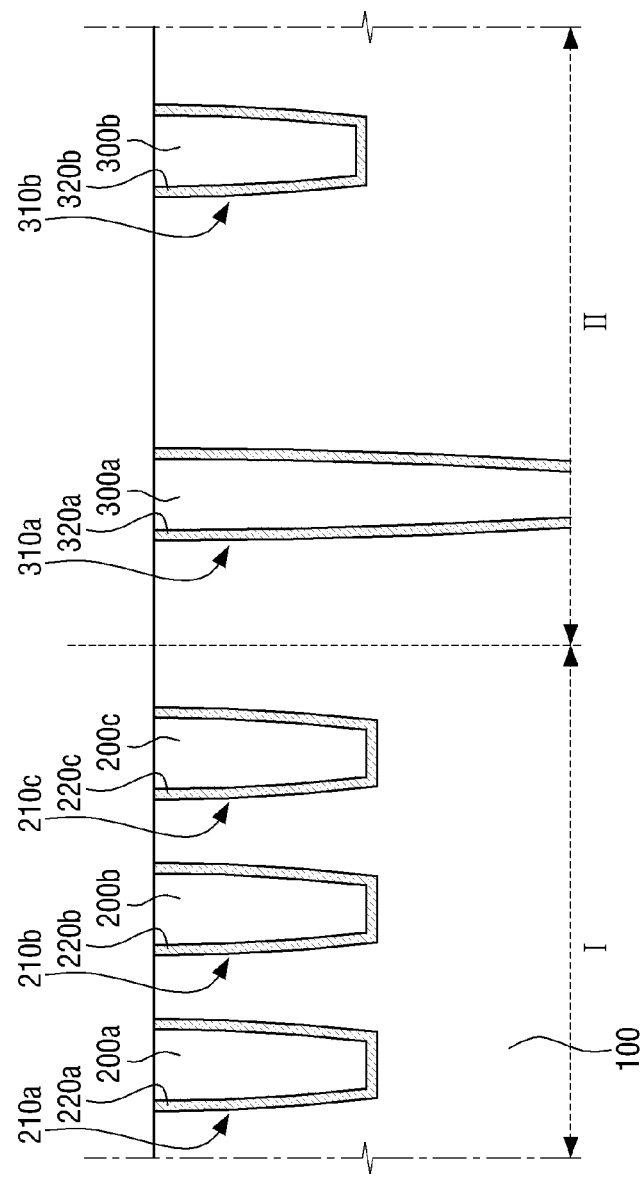

Referring to FIG. 16, first metals 200a, 200b and 200c and second metals 300a and 300b may be formed. The first metals 200a, 200b and 200c can fill the first trenches 210a, 210b and 210c. The first metals 200a, 200b and 200c are formed on the first barrier metals 220a, 220b and 220c to completely fill the first trenches 210a, 210b and 210c.

The second metals 300a and 300b can fill the second trenches 310a and 310b. The second metals 300a and 300b are formed on the second barrier metals 320a and 320b to completely fill the second trenches 310a and 310b. The first metals 200a, 200b and 200c and the second metals 300a and 300b may be simultaneously formed. Specifically, the first metals 200a, 200b and 200c and the second metals 300a and 300b are formed to completely cover the upper surface of the first interlayer insulating film 100, and are then separated to be located on only the respective inner walls of the first trenches 210a, 210b and 210c and the second trenches 310a and 310b by a flattening process later.

Each of the first metals 200a, 200b and 200c and the second metals 300a and 300b may include Cu. In this case, a damascene process may be used, which is not limited thereto. Each of the first metals 200a, 200b and 200c and the second metals 300a and 300b may include another conductor. For example, each of the first metals 200a, 200b and 200c and the second metals 300a and 300b may include at least one of Co, W, and Al.

Figure 17:
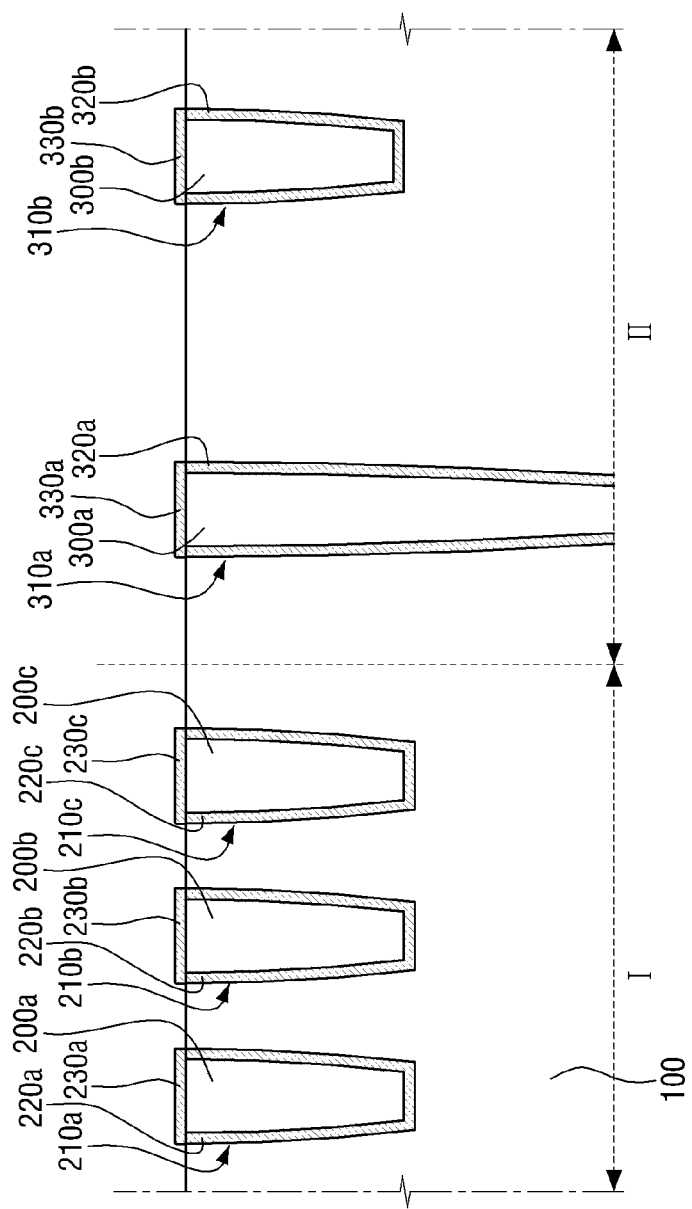

Referring to FIG. 17, first capping films 230a, 230b and 230c and second capping films 330a and 330b are formed. The first capping films 230a, 230b and 230c may be formed on the first metals 200a, 200b and 200c of the first trenches 210a, 210b and 210c and on the first barrier metals 220a, 220b and 220c, respectively. The second capping films 330a and 330b may be formed on the second metals 300a and 300b of the second trenches 310a and 310b and on the second barrier metals 320a and 320b, respectively.

Since a plurality of first trenches 210a, 210b and 210c and a plurality of first metals 200a, 200b and 200c are formed, a plurality of first capping films 230a, 230b and 230c may also be formed. The plurality of first capping films 230a, 230b and 230c may be formed to be separated from each other. Since a plurality of second trenches 310a and 310b and a plurality of second metals 300a and 300b are formed, a plurality of second capping films 330a and 330b may also be formed. The plurality of second capping films 330a and 330b may be formed to be separated from each other.

Each of the first capping films 230a, 230b and 230c and the second capping films 330a and 330b may include Co and/or AlN, which is not limited thereto, and may also include another conductor. The first capping films 230a, 230b and 230c and the second capping films 330a and 330b may be formed by various processes.

Specifically, the first capping films 230a, 230b and 230c and the second capping films 330a and 330b may be formed by chemical vapor deposition (CVD) or electroless deposition (ELD), which is not limited thereto.

Figure 18:
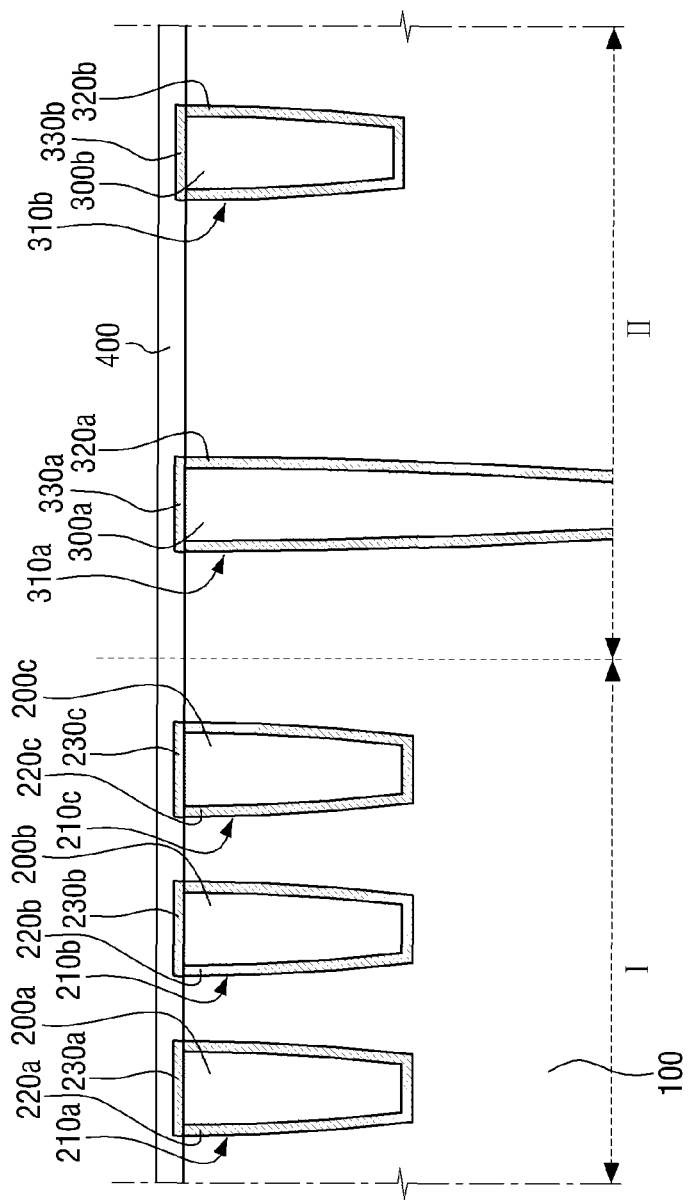

Referring to FIG. 18, a first intermediate film 400 is formed. The first intermediate film 400 may be formed on the first interlayer insulating film 100. The first intermediate film 400 may be thinner than the first interlayer insulating film 100. The first intermediate film 400 may contain SiCN or SiOC, which is not limited thereto.

The first intermediate film 400 may be formed on the first capping films 230a, 230b and 230c and the second capping films 330a and 330b. As shown in FIG. 18, the first intermediate film 400 may be thicker than the first capping films 230a, 230b and 230c and the second capping films 330a and 330b. That is, the first intermediate film 400 can completely cover the first capping films 230a, 230b and 230c and the second capping films 330a and 330b.

Figure 19:
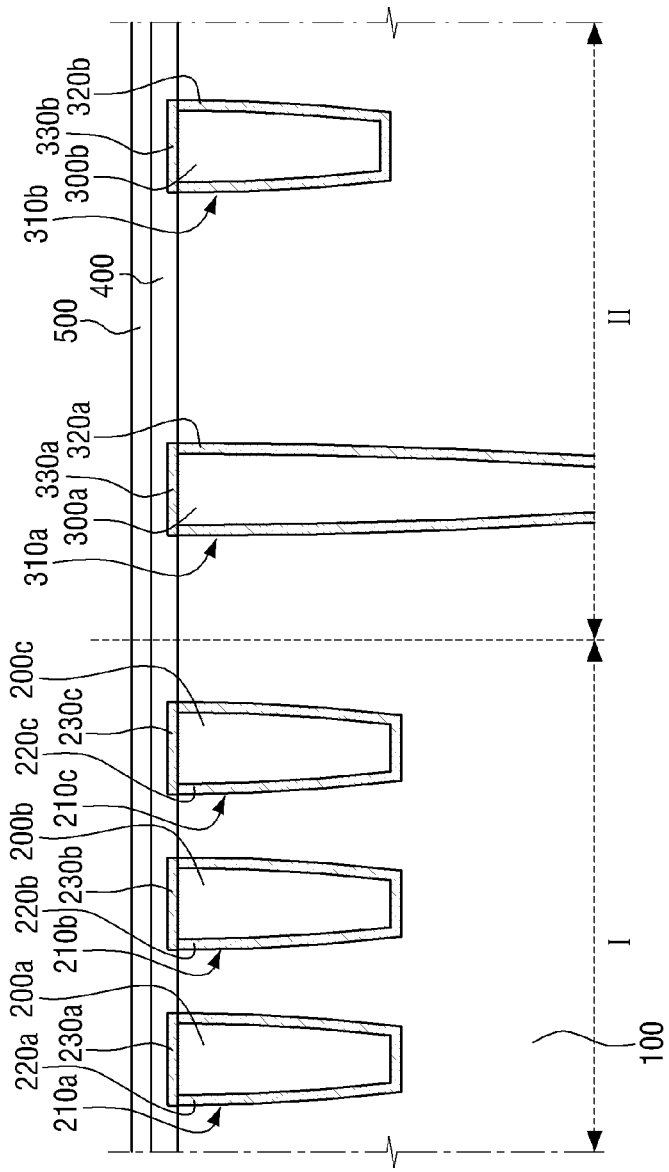

Referring to FIG. 19, a first mask film 500 is formed. The first mask film 500 may be formed on the first intermediate film 400. The first mask film 500 may be thinner than the first interlayer insulating film 100. The first mask film 500 may contain SiON, which is not limited thereto.

The first mask film 500 can serve as a mask allowing the first interlayer insulating film 100 in the second region (II) not to be etched while the first region (I) will be etched later. The etch selection rate of the first mask film 500 may be lower than that of the first interlayer insulating film 100.

Figure 20:
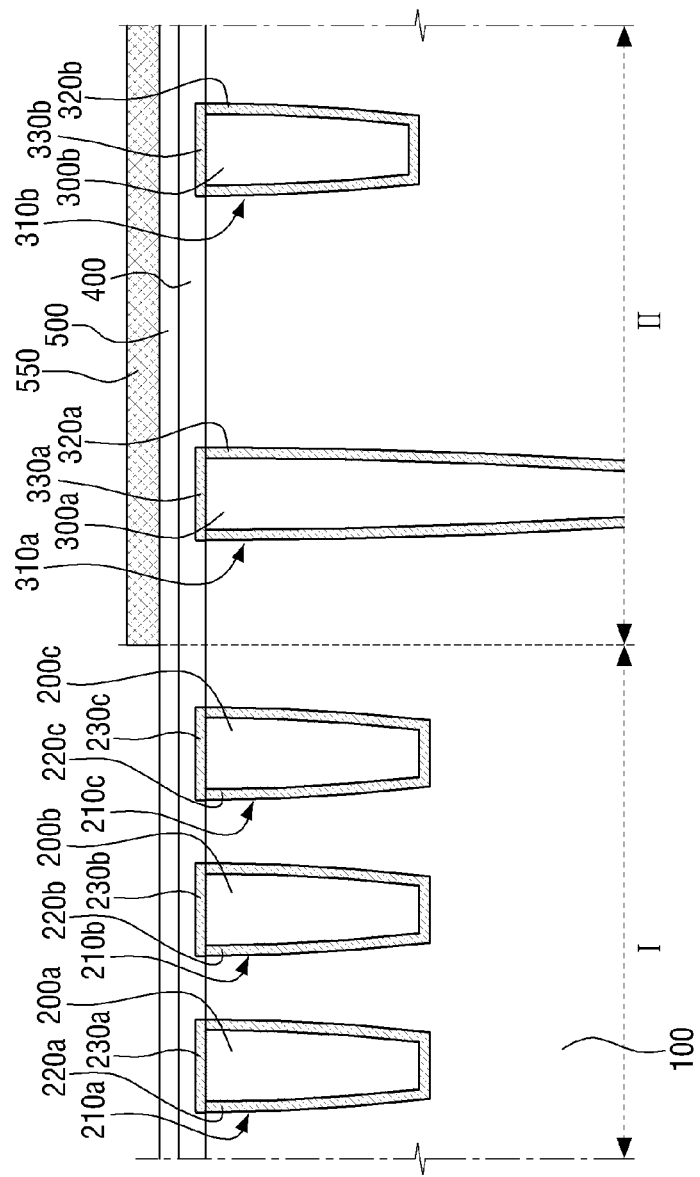

Referring to FIG. 20, a photoresist 550 is formed. The photoresist 550 may be formed on the first mask film 500. The photoresist 550 may be formed in the second region (II). The photoresist 550 may not be formed in the first region (I).

The photoresist 550 can be formed in order to selectively etch the first mask film 500. That is, the photoresist 550 can be formed in order to protect the first mask film 500 in the second region (II) through a photolithography process by selectively removing the first mask film 500 in the first region (I). The light source for photolithography may contain at least one of KrF and ArF, and the type of the photoresist 550 can be determined in response to this.

Figure 21:
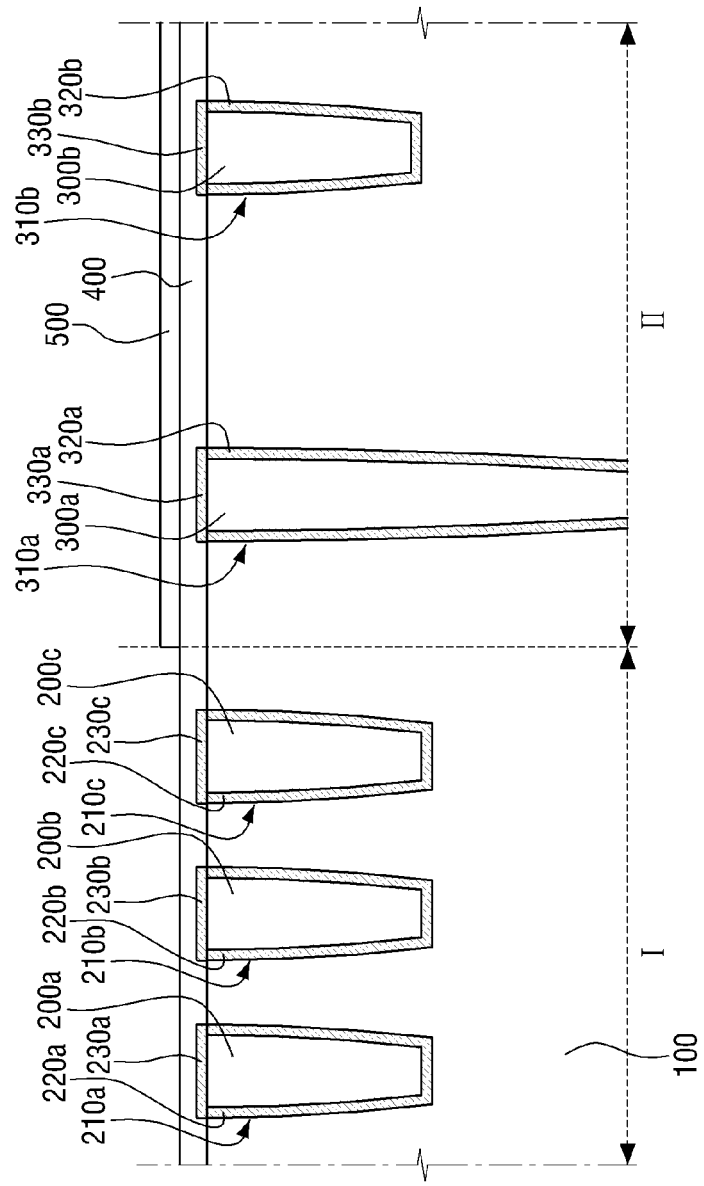

Referring to FIG. 21, the first mask film 500 is selectively etched. The first mask film 500 in the first region (I) may be etched, and the first mask film 500 in the second region (II) may not be etched. Since the first mask film 500 in the first region (I) is exposed by the photolithography process, it is etched. In contrast, since the first mask film 500 in the second region (II) is not exposed by the lithography process, it is not etched.

The photoresist 550 can be removed after the photolithography process. The removal of the photoresist 550 is not particularly limited, and may be performed using ashing, etching or the like.

Figure 22:
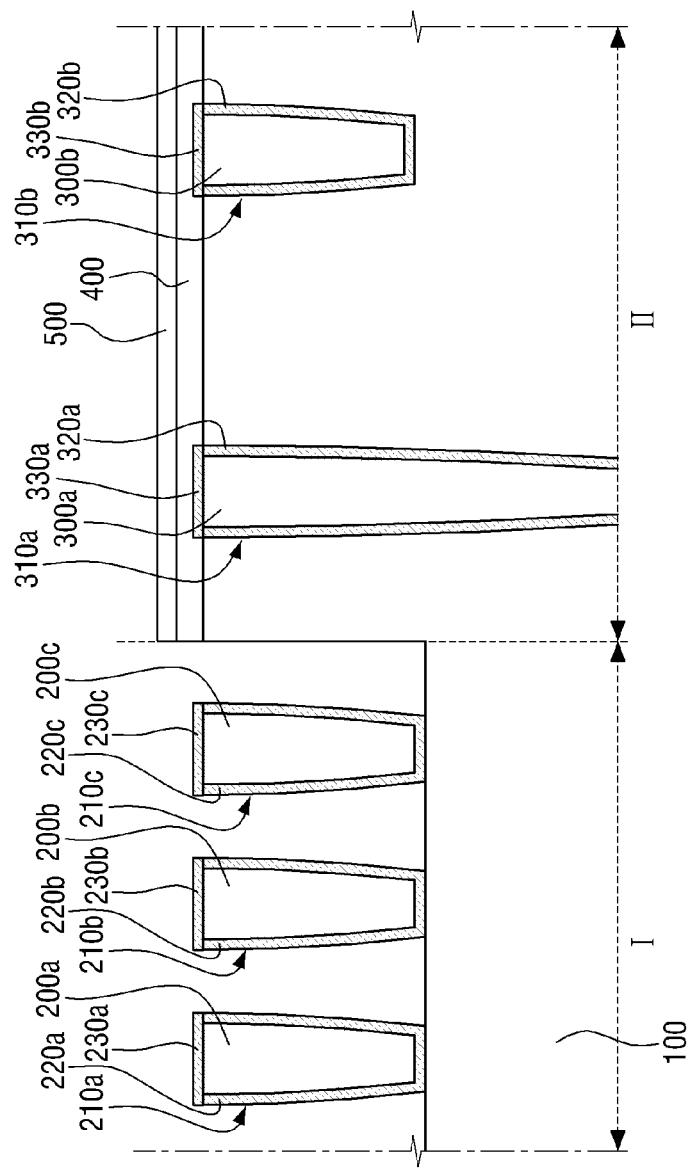

Referring to FIG. 22, the first region (I) of the first interlayer insulating film 100 is etched. Only the first region (I) of the first interlayer insulating film 100 may be selectively etched. The second region (II) of the first interlayer insulating film 100 may be maintained, not etched, because the first make film 500 is disposed thereon.

Only a part of the first region (I) of the first interlayer insulating film 100 may be etched. The first interlayer insulating film 100 may be etched such that the lateral sides of the first barrier metals 220a, 220b and 220c are exposed. It is shown in FIG. 22 that the lateral sides of the first barrier metals 220a, 220b and 220c are completely exposed, which is not limited thereto. However, since first air gaps 700 must be formed at the lateral sides of the first metals 200a, 200b and 200c, the first region (I) of the first interlayer insulating film 100 must be etched to a sufficient depth.

Figure 23:
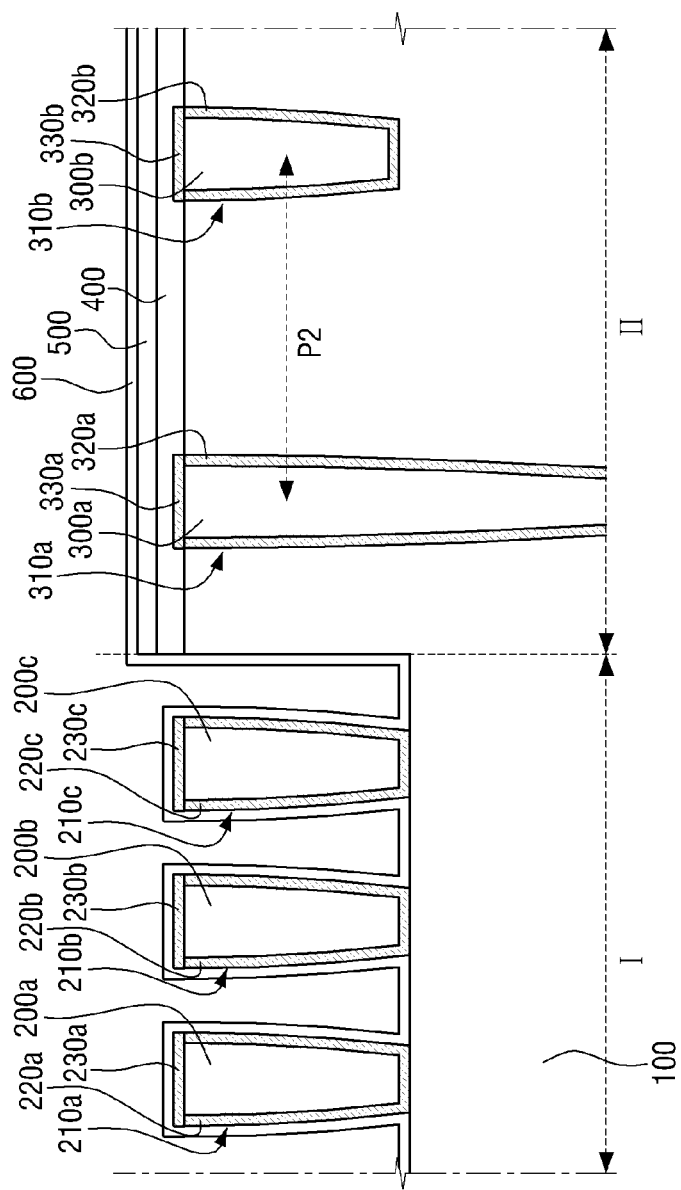

Referring to FIG. 23, a first coating film 600 is formed. The first coating film 600 may be formed in the first region (I) and the second region (II). In the first region (I), the first coating film 600 may be formed on the exposed upper surface of the first interlayer insulating film 100, the exposed lateral sides of the first barrier metals 220a, 220b and 220c and the upper surfaces of the first capping films 230a, 230b and 230c. The first coating film 600 may be conformally formed along the exposed upper surface of the first interlayer insulating film 100, the exposed lateral sides of the first barrier metals 220a, 220b and 220c and the upper surfaces of the first capping films 230a, 230b and 230c.

In the second region (II), the first coating film 600 may be formed on the first mask film 500. The first coating film may be formed along the etched lateral surface of the first interlayer insulating film 100, which is a boundary between the first region (I) and the second region (II). That is, the first coating layer may be formed over the entire first region (I) and second region (II).

Referring to FIG. 1, a second interlayer insulating film 900 and first air gaps 700 are formed. The second interlayer insulating film 900 may be formed in the first region (I). The second interlayer insulating film 900 may be formed on the first interlayer insulating film 100, the first barrier metals 220a, 220b and 220c and the first capping films 230a, 230b and 230c. The second interlayer insulating film 900 may be formed using a process having poor step coverage. For example, the second interlayer insulating film 900 may be formed by chemical vapor deposition (CVD) or physical vapor deposition (PVD), which is not limited thereto.

The air gaps 700 may be surrounded by the second interlayer insulating film 900, which is not limited thereto. Each of the air gaps 700 may be partially in contact with the first coating film.

The semiconductor device 1 according to an example embodiment of the inventive concepts, manufactured by the above method, have a low dielectric constant due to the first air gaps 700, and the first interlayer insulating film 100 have a low dielectric constant even in a region in which the first air gaps 700 are not formed, so that the capacitance of the semiconductor device 1 is reduced, thereby improving the reliability of the semiconductor device 1. Further, in this semiconductor device 1, the damage of the first interlayer insulating film 100 due to etching can be minimized by a pore stuffing process 105, thereby improving the reliability of the semiconductor device 1.

Hereinafter, a method of manufacturing the semiconductor device 2 according to an example embodiment of the inventive concepts will be described with reference to FIGS. 3, 4 and 7 to 26. Throughout the accompanying drawings, the same reference numerals are used to designate the same or similar components. Therefore, redundant descriptions thereof duplicated with the above descriptions of the semiconductor devices 1 and 2 in the first and second example embodiments will be omitted or abbreviated.

Figure 24:
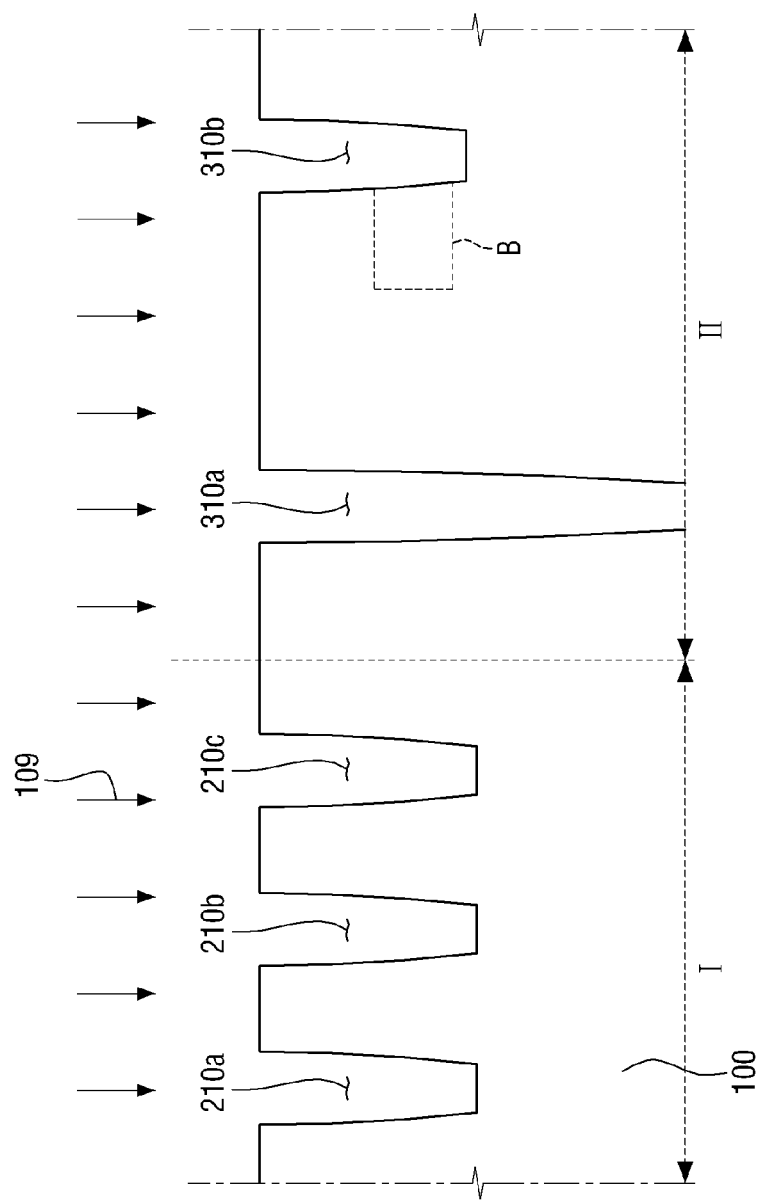
FIGS. 24 to 26 are intermediate views for explaining a method of manufacturing a semiconductor device according to an example embodiment of the inventive concepts.
Figure 25:
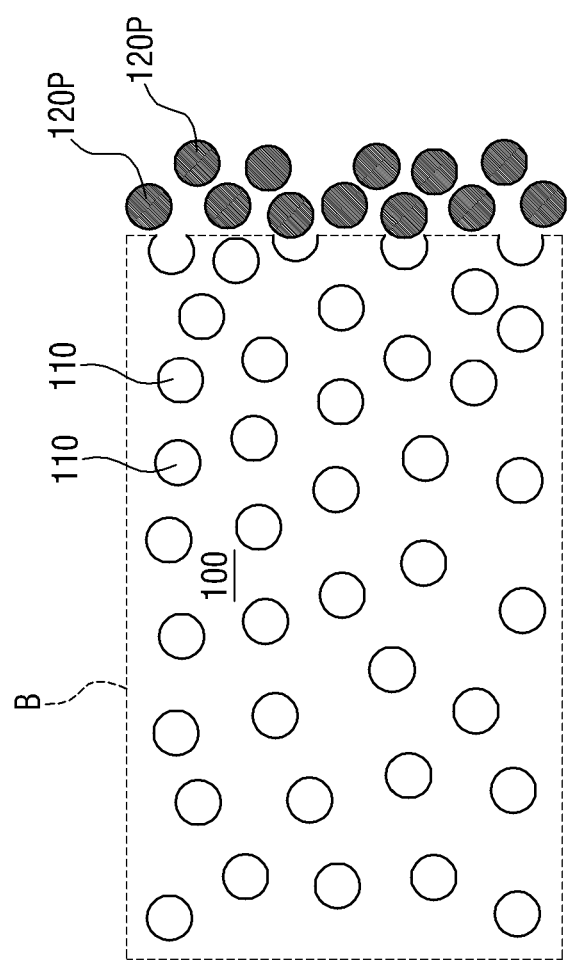
Figure 26:
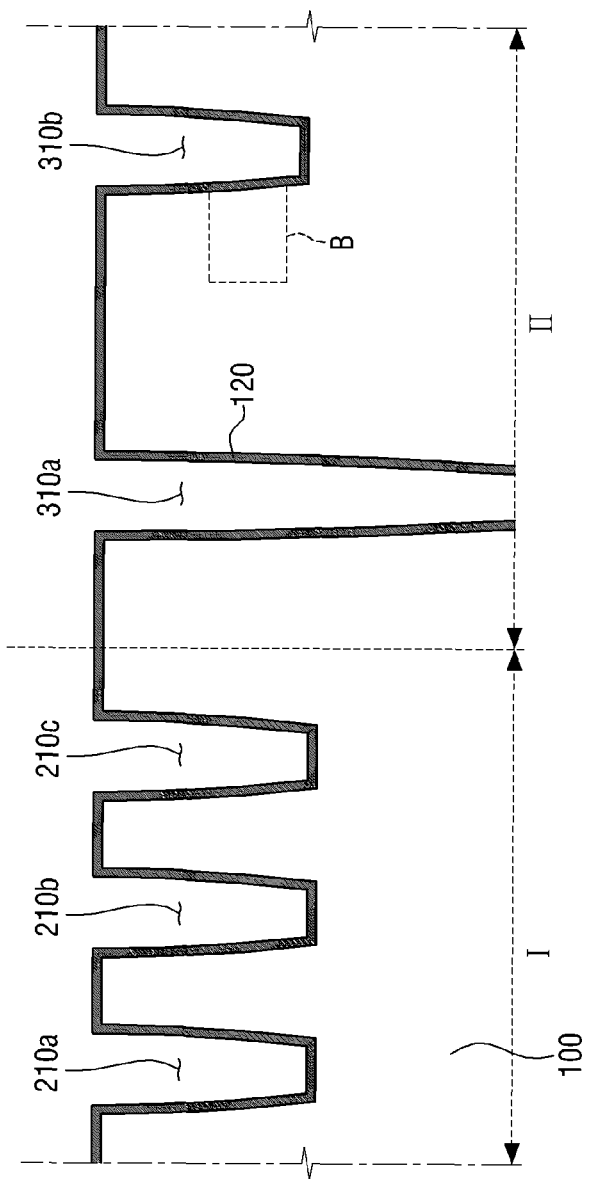

FIGS. 24 to 26 are intermediate views for explaining a method of manufacturing the semiconductor device 2 according to an example embodiment of the inventive concepts. FIG. 25 is an enlarged sectional view for explaining B in FIG. 24.

In the method of manufacturing the semiconductor device 2 according to an example embodiment of the inventive concepts, the processes having described with reference to FIGS. 7 to 10 are substantially the same as those in method of manufacturing the semiconductor device 1 according to an example embodiment of the t inventive concepts. Therefore, the processes thereafter are described.

Referring to FIGS. 24 and 25, first trenches 210a, 210b and 210c and second trenches 310a and 310b are formed. Unlike the above-described semiconductor device 1 according to an example embodiment, here, only pores 110 are formed without performing a pore stuffing process. Therefore, due to the formation of the first trenches 210a, 210b and 210c and the second trenches 310a and 310b, the etched surface of the first interlayer insulating film 100 and the inner walls of the first trenches 210a, 210b and 210c and the second trenches 310a and 310b may be damaged.

In order to compensate for this problem, a pore sealing process 109 can be performed. The pore sealing process 109 may be effective at curing the damaged surface of the first interlayer insulating film 100. That is, precursors 120p form a film on the surface of the first interlayer insulating film 100 to cure the damaged surface thereof. The porosity of the first interlayer insulating film 100 for the pore sealing process 109 may be 0% to 60%, which is not limited thereto.

The precursors 120p can approach the surface of the first interlayer insulating film 100. The precursors 120p can form a sealing film 120 later. Each of the precursors 120p may be a bulky chemical material. Each of the precursors 120p may include at least one of octamethyl cyclotetrasiloxane and hexamethyl cyclotrisilazane, which is not limited thereto.

Referring to FIGS. 26 and 4, a sealing film 120 is formed. The sealing film 120 may be formed on the inner walls of the first trenches 210a, 210b and 210c and the second trenches 310a and 310b. The inner wall is a concept including all side walls and a bottom. The sealing film may also be formed on the upper surface of the first interlayer insulating film 100. That is, as shown in FIG. 26, the sealing film 120 may be formed over the entire first region (I) and second region (II).

Subsequent processes are the same as those in the method of manufacturing the semiconductor device 1 according to an example embodiment of the inventive concepts. That is, the processed shown in FIGS. 15 to 23 are directly applied except for the presence of the sealing film 120. Finally, the semiconductor device 2 according to an example embodiment of the inventive concepts can be completed.

Hereinafter, a method of manufacturing the semiconductor device 3 according to an example embodiment of the inventive concepts will be described with reference to FIGS. 5, 7 to 26, 27 and 28. Throughout the accompanying drawings, the same reference numerals are used to designate the same or similar components. Therefore, redundant descriptions thereof duplicated with the above descriptions of the semiconductor devices 1, 2 and 3 in the first, second and third example embodiments will be omitted or abbreviated.

Figure 27:
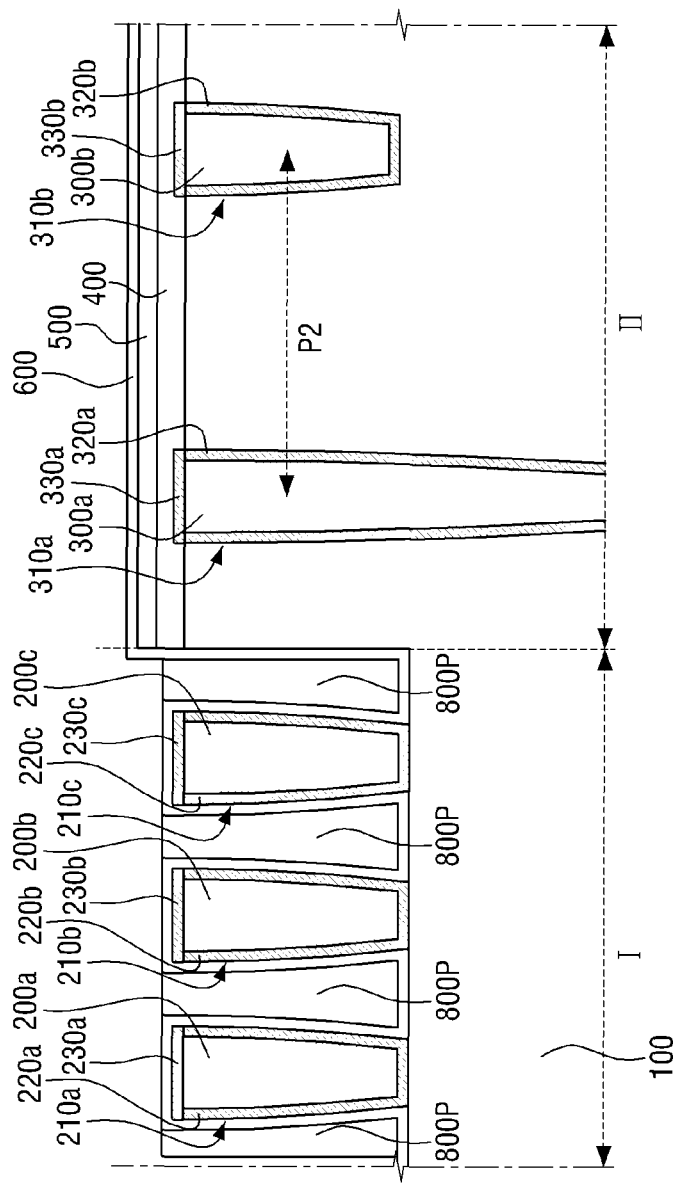
FIGS. 27 and 28 are intermediate views for explaining a method of manufacturing a semiconductor device according to an example embodiment of the inventive concepts.
Figure 28:
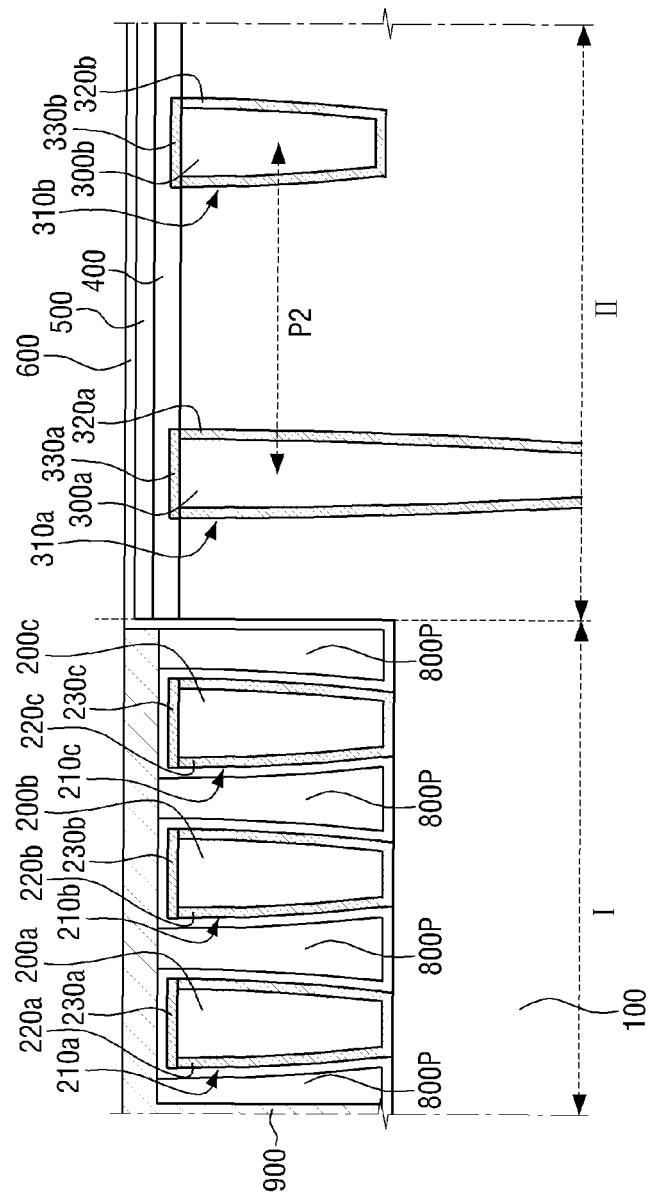

FIGS. 27 and 28 are intermediate views for explaining a method of manufacturing the semiconductor device 3 according to an example embodiment of the inventive concepts.

In the method of manufacturing the semiconductor device 3 according to an example embodiment of the inventive concepts, the processes having described with reference to FIGS. 7 to 26 are substantially the same as those in method of manufacturing the semiconductor device 2 according to an example embodiment of the inventive concepts. Therefore, the processes thereafter are described.

Referring to FIG. 27, sacrificial films 800p are formed. The sacrificial films 800p may be formed in the first region (I). The sacrificial films 800p may be formed on the first interlayer insulating film 100 in the first region (I). The sacrificial films 800p may be formed on the lateral sides of the first metals 200a, 200b and 200c and the first barrier metals 220a, 220b and 220c and the coating film 600. Specifically, as shown in FIG. 27, the sacrificial films 800p may be formed in the spaces between a plurality of first metals 200a, 200b and 200c and a plurality of first barrier metals 220a, 220b and 220c.

In FIG. 27, the sacrificial films 800p are formed to fill the spaces between the first metals 200a, 200b and 200c, but are not limited thereto. The sacrificial films 800p can provide the spaces for forming second air gaps 800 later. Each of the sacrificial films 800p may be formed to fill a part of the space between the first metals 200a, 200b and 200c. That is, the sacrificial films 800p may be formed in consideration of the positions and shapes of the second air gaps 800 which will be formed later.

Referring to FIG. 28, a second interlayer insulating film 900 is formed. The second interlayer insulating film 900 may be formed on the upper surfaces the sacrificial films 800p and the first coating film 600. The second interlayer insulating film 900 may be formed while filling the spaces in which the sacrificial films 800p are not formed. That is, as shown in FIG. 28, when the sacrificial films 800p fully fill the spaces between the spaces surrounded by the first coating film 600, the second interlayer insulating film 900 can be formed on the upper surfaces of the sacrificial films 800p, but when each of the sacrificial films 800p is formed in a part of the space between the first metals 200a, 200b and 200c, the second interlayer insulating film 900 can also be formed in the remaining space.

Referring to FIG. 5, second air gaps 800 may be formed by removing the sacrificial films 800p. The sacrificial films 800p may be partially exposed, not completely sealed by the second interlayer insulating film 900. The sacrificial films 800p can be removed through the exposed portion. Therefore, the second air gaps can be formed.

The second air gaps 800 may be formed in desired shapes at desired positions. Therefore, the first interlayer insulating film 100 of the semiconductor device 3 according to an example embodiment of the inventive concepts can have a lower dielectric constant due to the second air gaps 800, and thus the parasitic capacitance of the semiconductor device 3 can be further lowered.

Figure 29:
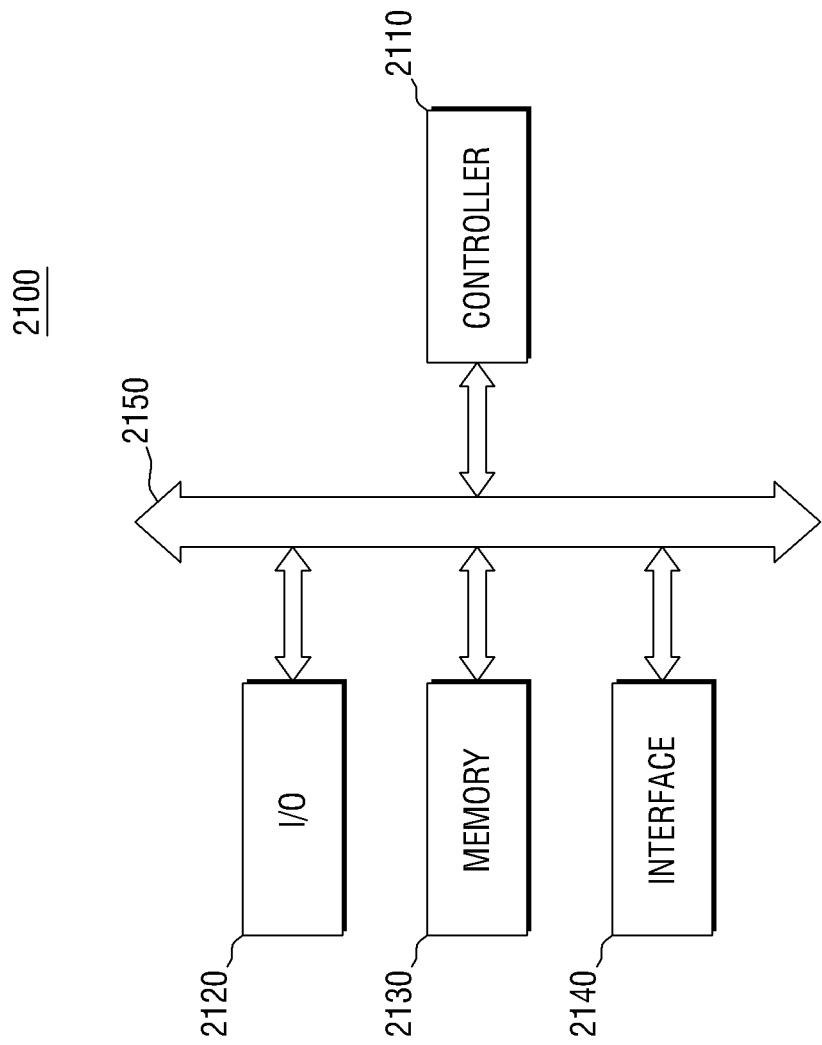
FIG. 29 is a block diagram showing an electronic system including the semiconductor devices according to example embodiments of the inventive concepts.

FIG. 29 is a block diagram showing an electronic system including the semiconductor devices according to example embodiments of the inventive concepts.

Referring to FIG. 29, an electronic system 2100 according to an example embodiment of the inventive concepts may include a controller 2110, an input/output (I/O) unit 2120, a memory unit 2130, an interface 2140, and a bus 2150. The controller 2110, the input/output (I/O) unit 2120, the memory unit 2130, and/or the interface 2140 are connected to each other through the bus 2150. The bus refers to a path through which data is transferred.

The controller 2110 may include at least one of a microprocessor, a digital signal processor, a microcontroller, and a logic device having a similar function thereto. The input/output (I/O) unit 2120 may include a keypad, a keyboard, a display, and the like. The memory unit 2130 may include the semiconductor device according to some example embodiments of the inventive concepts. The memory unit 2130 may include DRAM. The memory unit 2130 may include the semiconductor devices 1 to 4 according to some embodiments of the inventive concepts.

The interface 2140 can perform a function of transmitting data to a communication network and receiving the data from the communication network. The interface 2140 may be a wired or wireless interface. For example, the interface 2140 may include an antenna or a wired and wireless transceiver.

The electronic system 2100 can be applied to personal digital assistants (PDAs), portable computers, web tablets, wireless phones, mobile phones, digital music players, memory card, and other electronic products transmitting and/or receiving information in a wireless environment.

Figure 30:
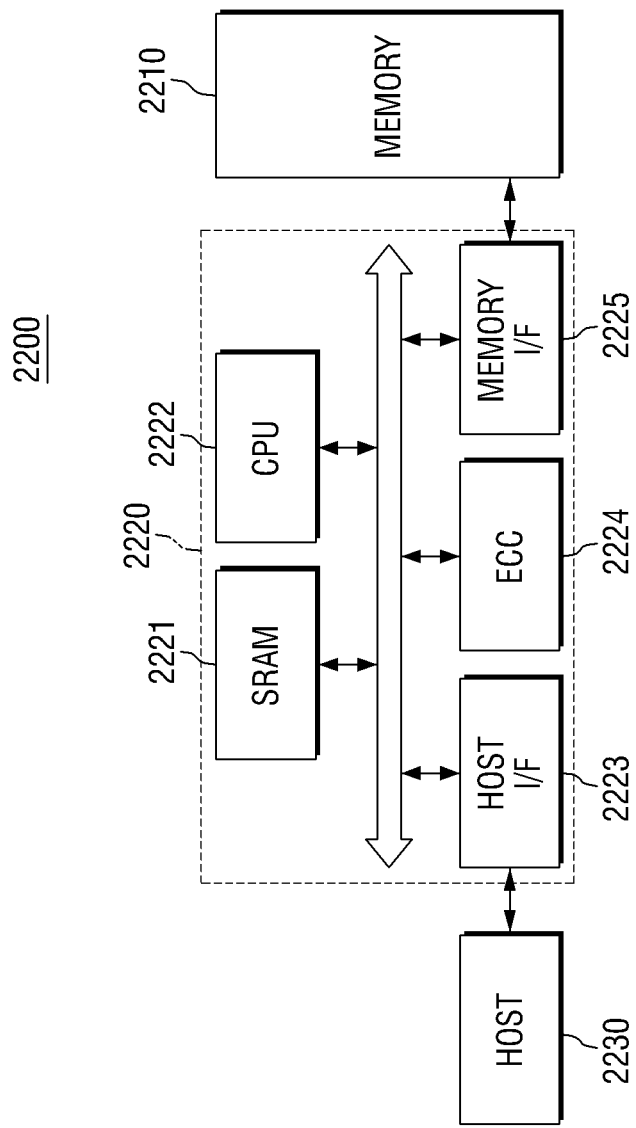
FIG. 30 is a block diagram showing a memory card including the semiconductor devices according to example embodiments of the inventive concepts.

FIG. 30 is a block diagram showing a memory card including the semiconductor devices according to some example embodiments of the inventive concepts.

Referring to FIG. 30, a memory card 2200 according to an example embodiment of the present inventive concepts may employ memory 2210 including a reference voltage training device. The memory card 2200 may include a memory controller 2220 controlling the data exchange between a host 2230 and the memory 2210. SRAM 2221 can be used as operation memory of a central processing unit (CPU) 2222. A host interface 2223 may include a protocol for data exchange due to the connection of a host 2230 and the memory card 2200. An error correction code (ECC) can detect and correct the error of data read from the memory 2210. A memory interface 2225 can communicated with the memory 2210. The central processing unit (CPU) 2222 can perform the overall control operation related to the data exchange of the memory controller 2220.

Figure 31:
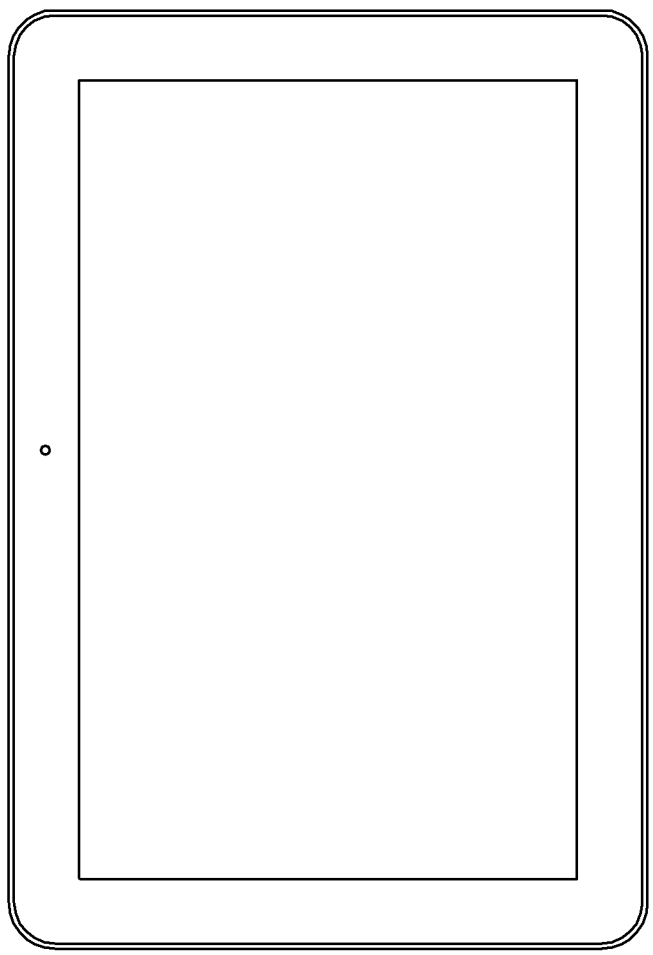
FIGS. 31 and 32 are perspective views showing example semiconductor systems that can apply the semiconductor devices according to some example embodiments of the inventive concepts.
Figure 32:
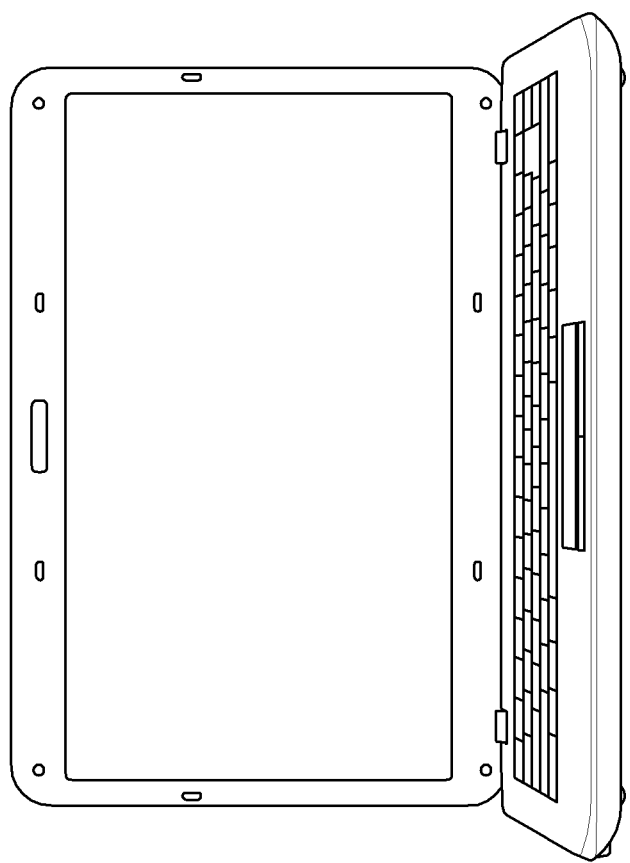

FIGS. 31 and 32 are perspective views showing example semiconductor systems that can apply the semiconductor devices according to some example embodiments of the inventive concepts. FIG. 31 shows a tablet PC, and FIG. 32 show a notebook computer. At least one of the semiconductor devices 1 to 4 according to the example embodiments of the present inventive concepts can be used in a tablet PC or a notebook computer. It is obvious to those skilled in the art that the semiconductor devices according to some example embodiments of the inventive concepts can be applied to other non-exemplified integrated circuit systems.

While the inventive concepts have been particularly shown and described with reference to example embodiments thereof, it will be understood by those of ordinary skill in the art that various changes in form and details may be made therein without departing from the spirit and scope of the inventive concepts as defined by the following claims. It is therefore desired that the example embodiments be considered in all respects as illustrative and not restrictive, reference being made to the appended claims rather than the foregoing description to indicate the scope of the invention.

What is claimed is:

1. A semiconductor device, comprising:
a first porous interlayer insulating film having a low dielectric constant and including a first region and a second region;
a second interlayer insulating film formed on the first interlayer insulating film in the first region;
a plurality of first conductive patterns formed in the second interlayer insulating film such that they are spaced apart from each other;
at least one second conductive pattern formed in the first interlayer insulating film in the second region; and
air gaps disposed at lateral sides of the plurality of first conductive patterns.

2. The semiconductor device of claim 1,
wherein upper surfaces of the first conductive patterns are coplanar with an upper surface of the second conductive pattern.

3. The semiconductor device of claim 1, further comprising:
a first trench formed in the first interlayer insulating film and filled with the second conductive pattern; and
a sealing film formed on the inner wall of the first trench to seal the inner wall surface of the first interlayer insulating film.

4. The semiconductor device of claim 3, further comprising:
a barrier metal between the sealing film and the second conductive pattern.

5. The semiconductor device of claim 1,
wherein a height of an upper surface of the first interlayer insulating film in the first region is lower than a height of an upper surface of the first interlayer insulating film in the second region.

6. The semiconductor device of claim 1,
wherein each of the first and/or second conductive patterns includes a via penetrating the first interlayer insulating film.

7. The semiconductor device of claim 1, further comprising:
a capping film formed on an upper surface of each of the first and second conductive patterns to cover each of the first and second conductive patterns.

8. The semiconductor device of claim 7,
wherein the capping film includes Co and/or AlN.

9. The semiconductor device of claim 1,
wherein each of the first and second conductive patterns includes Cu, W, Co, and/or Al.

10. The semiconductor device of claim 1,
wherein the air gaps are formed only between the plurality of first conductive patterns.

11. The semiconductor device of claim 1, wherein the second conductive pattern comprises at least two conductive patterns, and
  wherein an interval between the at least two second conductive patterns is equal to or greater than an interval between the first conductive patterns.

12. A semiconductor device, comprising:
  a first structure including a first region and a second region; and
  a second structure including a third region and a fourth region and disposed on the first structure,
  wherein the first structure includes:
  a first interlayer insulating film including a first porous ultra-low-dielectric constant material;
  a second interlayer insulating film formed on the first interlayer insulating film in the first region;
  a plurality of first conductive patterns formed in the second interlayer insulating film such that the plurality of first conductive patterns are spaced apart from each other;
  at least one second conductive pattern formed in the first interlayer insulating film in the second region; and
  first air gaps disposed at lateral sides of the plurality of first conductive patterns, and
  wherein the second structure includes:
  a third interlayer insulating film containing a second porous ultra-low-dielectric constant material;
  a fourth interlayer insulating film formed on the third interlayer insulating film in the third region;
  a plurality of third conductive patterns formed in the fourth interlayer insulating film such that the plurality of third conductive patterns are spaced apart from each other;
  at least one fourth conductive pattern formed in the third interlayer insulating film in the fourth region; and
  second air gaps disposed at lateral sides of the plurality of third conductive patterns.

13. The semiconductor device of claim 12, wherein the dielectric constant of the first interlayer insulating film is different from the dielectric constant of the third interlayer insulating film.

14. The semiconductor device of claim 13, wherein the dielectric constant of the first interlayer insulating film is greater than the dielectric constant of the third interlayer insulating film.

15. The semiconductor device of claim 12, wherein the porosity of the first porous ultra-low-dielectric constant material is different from the porosity of the second porous ultra-low-dielectric constant material.

16. The semiconductor device of claim 12, further comprising:
  a first trench formed in the first interlayer insulating film and filled with the second conductive pattern;
  a second trench formed in the third interlayer insulating film and filled with the fourth conductive pattern; and
  a sealing film conformally formed on the inner wall of the first trench and/or the second trench to seal the inner wall surface of the first interlayer insulating film and/or the third interlayer insulating film.

17. A semiconductor device, comprising:
  a first porous interlayer insulating film containing a porous ultra-low-dielectric constant material;
  a plurality of conductive patterns formed on the first interlayer insulating film such that the plurality of conductive patterns are spaced apart from each other;
  air gaps formed at lateral sides of the plurality of conductive patterns; and
  a second interlayer insulating film formed on the plurality of conductive patterns, the air gaps, and the first interlayer insulating film.

18. The semiconductor device of claim 17,
  wherein some of the plurality of conductive patterns include a via pattern penetrating the first interlayer insulating film.

19. The semiconductor device of claim 17,
  wherein the porosity of the porous ultra-low-dielectric constant material is 0% to 80%.

20. The semiconductor device of claim 17, further comprising:
  a coating film formed between the first interlayer insulating film and the air gaps.

* * * * *